United States Patent
Komoto et al.

(10) Patent No.: US 12,120,960 B2
(45) Date of Patent: Oct. 15, 2024

(54) PIEZOELECTRIC SPEAKER

(71) Applicant: NITTO DENKO CORPORATION, Ibaraki (JP)

(72) Inventors: Yusuke Komoto, Osaka (JP); Kohei Oto, Osaka (JP); Saori Yamamoto, Osaka (JP); Ryohei Oban, Osaka (JP); Tomoaki Hishiki, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 553 days.

(21) Appl. No.: 16/765,796

(22) PCT Filed: Nov. 20, 2018

(86) PCT No.: PCT/JP2018/042910
§ 371 (c)(1),
(2) Date: May 20, 2020

(87) PCT Pub. No.: WO2019/103018
PCT Pub. Date: May 31, 2019

(65) Prior Publication Data
US 2020/0287125 A1  Sep. 10, 2020

(30) Foreign Application Priority Data

Nov. 21, 2017 (JP) .................. 2017-223793
Nov. 21, 2017 (JP) .................. 2017-223800

(51) Int. Cl.
*H02N 2/00* (2006.01)
*B32B 7/025* (2019.01)
(Continued)

(52) U.S. Cl.
CPC .......... *H10N 30/857* (2023.02); *B32B 7/025* (2019.01); *B32B 7/12* (2013.01); *H04R 17/00* (2013.01); *H10N 30/2047* (2023.02)

(58) Field of Classification Search
CPC .......... H04R 17/00; B32B 7/025; B32B 7/12; H10N 30/086; G02F 1/33; B41J 2/161; B41J 2/1629; H01L 41/09
(Continued)

(56) References Cited

U.S. PATENT DOCUMENTS

2004/0257636 A1* 12/2004 Shibuya .................. G02F 1/33
359/305
2005/0128255 A1 6/2005 Nakanishi
(Continued)

FOREIGN PATENT DOCUMENTS

CN 103428621 12/2013
JP S6381599 5/1988
(Continued)

OTHER PUBLICATIONS

Extended European Search Report issued for European Patent Application No. 18881786.0, dated Aug. 17, 2021, 9 pages.
(Continued)

*Primary Examiner* — Md S Elahee
(74) *Attorney, Agent, or Firm* — HSML P.C.

(57) ABSTRACT

A piezoelectric speaker (10) includes a piezoelectric film (35), a first joining layer (51), and an interposed layer (40). The piezoelectric film (35) includes a first electrode (61), a second electrode (62), and a piezoelectric body (30) sandwiched by the first electrode (61) and the second electrode (62). The first joining layer (51) is a layer having pressure-sensitive adhesiveness or adhesiveness. The interposed layer (40) is disposed between the piezoelectric film (35) and the first joining layer (51). Both principal surfaces of the piezoelectric film (35) vibrate up and down as a whole.

17 Claims, 18 Drawing Sheets

(51) Int. Cl.
*B32B 7/12* (2006.01)
*H04R 17/00* (2006.01)
*H10N 30/20* (2023.01)
*H10N 30/857* (2023.01)

(58) Field of Classification Search
USPC ........................................................ 310/311
See application file for complete search history.

(56) References Cited

U.S. PATENT DOCUMENTS

| | | |
|---|---|---|
| 2007/0019134 A1 | 1/2007 | Park et al. |
| 2009/0236935 A1 | 9/2009 | Kando |
| 2010/0156241 A1* | 6/2010 | Suzuki .................. H10N 30/086 |
| | | 29/25.35 |
| 2010/0231657 A1* | 9/2010 | Takahashi .............. B41J 2/1629 |
| | | 29/25.35 |
| 2013/0061438 A1 | 3/2013 | Kim et al. |
| 2013/0259274 A1 | 10/2013 | Hayashi et al. |
| 2017/0041082 A1 | 2/2017 | Kijima et al. |
| 2018/0069168 A1* | 3/2018 | Ikeuchi .................. H01L 41/09 |
| 2019/0122018 A1* | 4/2019 | Kho ........................ H04R 17/00 |

FOREIGN PATENT DOCUMENTS

| | | |
|---|---|---|
| JP | S63149997 | 6/1988 |
| JP | 2005303937 | 10/2005 |
| JP | 2015126605 A | 7/2015 |
| JP | 2016122187 | 7/2016 |
| JP | 2017034634 | 2/2017 |
| TW | 200520273 A | 6/2005 |
| WO | 2013046909 | 4/2013 |
| WO | 2016103826 A1 | 6/2016 |

OTHER PUBLICATIONS

International Search Report and Written Opinion issued for International Patent Application No. PCT/JP2018/042910, Date of mailing: Feb. 12, 2019, 9 pages including English translation of Search Report.
Office Action issued for Chinese Patent Application No. 201880075004.2, dated Oct. 22, 2020, 15 pages including English machine translation.
Notice of Reasons for Refusal issued for Japanese Patent Application No. 2019-555325, Dispatch Date: Dec. 27, 2022, 10 pages including English machine translation.
Office Action issued for Taiwanese Patent Application No. 107141514, dated Sep. 19, 2023, 14 pages including English translation.
Office Action issued for Taiwanese Patent Application No. 113110146, dated Apr. 24, 2024, 15 pages including English translation.
Office Action issued for Taiwanese Patent Application No. 107141514, Date of Issue: May 14, 2024, 13 pages including English translation.
Office Action issued for Taiwanese Patent Application No. 113110146, Date of Issue: Aug. 2, 2024, 15 pages including English translation.

* cited by examiner

| | Overall structure | Type of interposed layer | Thickness (mm) of interposed layer | Elastic modulus E (N/m²) of interposed layer | Structure of pores of interposed layer | Pore diameter (mm) of interposed layer | Porosity of interposed layer | Surface filling factor of interposed layer | Holding degree (N/m³) | Frequency (Hz) at which emission of sound starts |
|---|---|---|---|---|---|---|---|---|---|---|
| Reference Example 1 | Electrodes / PVDF | - | - | - | - | - | - | - | 0 | 3,500 |
| Example 1 | | Foam | 3 | 9.4E+04 | Closed-cell | 0.5 | 0.90 | 1.00 | 3.12E+07 | 3,300 |
| Example 2 | | Foam | 3 | 6.5E+04 | Semi-open-/semi-closed-cell | 0.5 | 0.90 | 0.10 | 2.17E+06 | 2,400 |
| Example 3 | Electrodes / PVDF / PSA Sheet / Foam / PSA Sheet / Stainless steel plate | Foam | 5 | 6.5E+04 | Semi-open-/semi-closed-cell | 0.5 | 0.90 | 0.10 | 1.30E+06 | 2,100 |
| Example 4 | | Foam | 10 | 6.5E+04 | Semi-open-/semi-closed-cell | 0.5 | 0.90 | 0.10 | 6.51E+05 | 1,400 |
| Example 5 | | Foam | 20 | 6.5E+04 | Semi-open-/semi-closed-cell | 0.5 | 0.90 | 0.10 | 3.25E+05 | 2,000 |
| Example 6 | | Foam | 20 | 2.1E+04 | Semi-open-/semi-closed-cell | 0.5 | 0.90 | 0.10 | 1.05E+05 | 3,000 |
| Example 7 | | Foam | 20 | 1.1E+04 | Semi-open-/semi-closed-cell | 0.5 | 0.95 | 0.05 | 2.83E+04 | 4,000 |
| Example 8 | Electrodes / PVDF / PSA Sheet / Porous metal body / PSA Sheet / Stainless steel plate | Porous metal body | 2 | 3.0E+06 | Open-cell | 0.9 | 0.95 | 0.05 | 7.62E+07 | 4,000 |
| Example 9 | Electrodes / PVDF / PSA Sheet / PSA Sheet / PSA Sheet / Stainless steel plate | Pressure-sensitive adhesive sheet | 3 | 2.5E+05 | Non-porous | - | 0.00 | 1.00 | 8.19E+07 | 6,000 |
| Example 10 | Electrodes / PVDF / PSA Sheet / Urethane foam / PSA Sheet / Stainless steel plate | Urethane foam | 5 | 2.0E+04 | Open-cell | 1.5 | 0.96 | 0.04 | 1.46E+05 | 3,000 |
| Example 11 | | Urethane foam | 10 | 1.6E+05 | Open-cell | 0.5 | 0.98 | 0.02 | 3.24E+05 | 2,500 |

※PSA:Pressure-sensitive adhesive

FIG.8A

| | Overall structure | Type of interposed layer | Thickness (mm) of interposed layer | Elastic modulus E (N/m²) of interposed layer | Structure of pores of interposed layer | Pore diameter (mm) of interposed layer | Porosity of interposed layer | Surface filling factor of interposed layer | Holding degree (N/m³) | Frequency (Hz) at which emission of sound starts |
|---|---|---|---|---|---|---|---|---|---|---|
| Example 12 | Electrodes / PVDF / PSA Sheet / Foam / PSA Sheet / Stainless steel plate | Foam | 5 | 1.1E+05 | Closed-cell | 0.4 | 0.88 | 0.12 | 2.82E+06 | 2,300 |
| Example 13 | Electrodes / PVDF / PSA Sheet / Foam / PSA Sheet / Stainless steel plate | Foam | 5 | 8.6E+04 | Closed-cell | 0.3 | 0.86 | 0.14 | 2.45E+06 | 2,400 |
| Example 14 | Electrodes / PVDF / PSA Sheet / Foam / PSA Sheet / Stainless steel plate | Foam | 5 | 1.2E+05 | Closed-cell | 0.3 | 0.79 | 0.21 | 5.17E+06 | 2,500 |
| Example 15 | Electrodes / PVDF / PSA Sheet / Foam / PSA Sheet / Stainless steel plate | Foam | 5 | 3.9E+04 | Closed-cell | 0.6 | 0.80 | 0.20 | 1.54E+06 | 1,800 |
| Example 16 | Electrodes / PLA / PSA Sheet / Foam / PSA Sheet / Stainless steel plate | Foam | 10 | 9.4E+04 | Closed-cell | 0.5 | 0.90 | 1.00 | 9.35E+06 | 2,200 |

※PSA:Pressure-sensitive adhesive

FIG.8B

PIEZOELECTRIC SPEAKER

TECHNICAL FIELD

The present invention relates to a piezoelectric speaker.

BACKGROUND ART

In recent years, a speaker employing a piezoelectric film (such a speaker may hereinafter be referred to as a piezoelectric speaker) is sometimes adopted as a speaker for audio equipment or for sound reduction. Piezoelectric speakers have an advantage in that they are small in volume and light.

Patent Literature 1 describes an exemplary piezoelectric speaker.

CITATION LIST

Patent Literature

Patent Literature 1: JP S63-149997 A
Patent Literature 2: JP 2016-122187 A

SUMMARY OF INVENTION

Technical Problem

In the piezoelectric speaker of Patent Literature 1, in order to ensure a sufficient volume of sound, an edge portion of a piezoelectric film is fixed by a supporting member and the piezoelectric film is kept in a curved shape. However, in view of achieving a piezoelectric speaker having fewer restrictions on its installation location, curving a piezoelectric film is desirably not essential.

The present invention aims to provide a piezoelectric speaker exhibiting practical acoustic characteristics even when a piezoelectric film is not kept in a curved shape.

Solution to Problem

The present invention provides a piezoelectric speaker, including:
- a first electrode;
- a second electrode;
- a piezoelectric film including a piezoelectric body sandwiched by the first electrode and the second electrode;
- a first joining layer having pressure-sensitive adhesiveness or adhesiveness; and
- an interposed layer disposed between the piezoelectric film and the first joining layer, wherein
- both principal surfaces of the piezoelectric film vibrate up and down as a whole.

Advantageous Effects of Invention

A piezoelectric speaker including a piezoelectric film whose both principal surfaces vibrate up and down as a whole can exhibit practical acoustic characteristics even when a piezoelectric film is not kept in a curved shape.

BRIEF DESCRIPTION OF DRAWINGS

FIG. 8A is a table showing the results of evaluation of samples.

FIG. 8B is a table showing the results of evaluation of samples.

DESCRIPTION OF EMBODIMENTS

Figure 1:
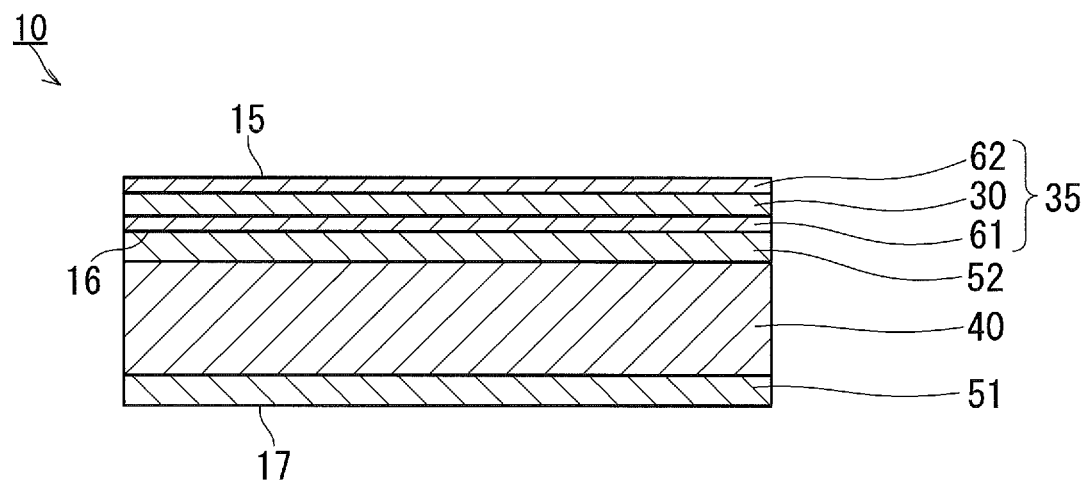
FIG. 1 is a cross-sectional view showing a piezoelectric speaker cut along the thickness direction thereof.

Hereinafter, embodiments of the present invention will be described with reference to the accompanying drawings. The following description is only illustrative of the embodiments of the present invention and has no intention to limit the present invention.

First Embodiment

A piezoelectric speaker according to a first embodiment will be described using FIG. 1 and FIG. 2. A piezoelectric speaker 10 includes a piezoelectric film 35, a first joining layer 51, an interposed layer 40, and a second joining layer 52. The first joining layer 51, the interposed layer 40, the second joining layer 52, and the piezoelectric film 35 are laminated in this order.

The piezoelectric film 35 includes a piezoelectric body 30, an electrode 51, and an electrode 52. The piezoelectric film 35 has the shape of a film.

The piezoelectric body 30 has the shape of a film. The piezoelectric body 30 is vibrated by application of voltage. A ceramic film, a resin film, and the like can be used as the piezoelectric body 30. Examples of the material of the piezoelectric body 30 that is a ceramic film include lead zirconate, lead zirconate titanate, lead lanthanum zirconate titanate, barium titanate, Bi-layered compounds, compounds having a tungsten bronze structure, and solid solutions of barium titanate and bismuth ferrite. Examples of the material of the piezoelectric body 30 that is a resin film include polyvinylidene fluoride and polylactic acid. The material of the piezoelectric body 30 that is a resin film may be a polyolefin such as polyethylene or polypropylene. The piezoelectric body 30 may be a non-porous body or may be a porous body.

The thickness of the piezoelectric body 30 is, for example, 10 μm to 300 μm and may be 30 μm to 110 μm.

The electrode 61 and the electrode 62 sandwich the piezoelectric body 30. Specifically, the piezoelectric body 30 is in contact with the electrode 61 and the electrode 62. The first electrode 61 and the second electrode 62 each have the shape of a film. The first electrode 61 and the second electrode 62 are each connected to a lead wire which is not illustrated. The first electrode 61 and the second electrode 62 can be formed on the piezoelectric body 30 by vapor deposition, plating, sputtering, or the like. A metal foil can be used as each of the first electrode 61 and the second electrode 62. A metal foil can be stuck to the piezoelectric body 30 using a double-faced tape, a pressure-sensitive adhesive, an adhesive, or the like. Examples of the materials of the first electrode 61 and the second electrode 62 include metals, and specific examples thereof include gold, platinum, silver, copper, palladium, chromium, molybdenum, iron, tin, aluminum, and nickel. Examples of the materials of the first electrode 61 and the second electrode 62 also include carbon and electrically conductive polymers. Examples of the materials of the first electrode 61 and the second electrode 62 also include alloys of the above metals. The first electrode 61 and the second electrode 62 may include, for example, a glass component.

The thickness of the first electrode 61 and that of the second electrode 62 are each, for example, 10 nm to 150 μm, and may be 20 nm to 100 μm.

Figure 2:
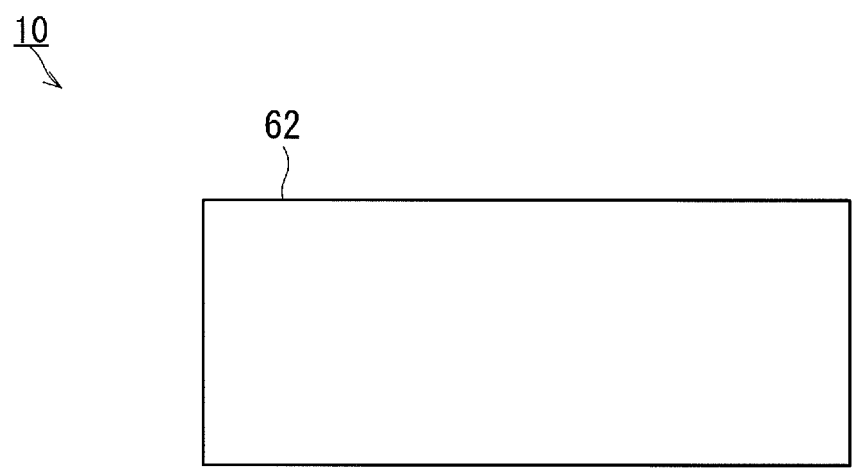
FIG. 2 is a top view showing a piezoelectric speaker viewed from the side opposite to a first joining face.

In the example in FIG. 1 and FIG. 2, the first electrode 61 covers one entire principal surface of the piezoelectric body 30. The first electrode 61 may cover only a portion of the one principal surface of the piezoelectric body 30. The second electrode 62 covers the other entire principal surface of the piezoelectric body 30. The second electrode 62 may cover only a portion of the other principal surface of the piezoelectric body 30.

The interposed layer 40 is disposed between the piezoelectric film 35 and the first joining layer 51. The interposed layer 40 may be a layer other than an adhesive layer and a pressure-sensitive adhesive layer, or may be an adhesive layer or a pressure-sensitive adhesive layer. In the present embodiment, the interposed layer 40 is a porous body layer and/or a resin layer. Here, the resin layer is a concept including a rubber layer and an elastomer layer. Therefore, the interposed layer 40 that is a resin layer may be a rubber layer or an elastomer layer. Examples of the interposed layer 40 that is a resin layer include an ethylene propylene rubber layer, a butyl rubber layer, a nitrile rubber layer, a natural rubber layer, a styrene-butadiene rubber layer, a silicone layer, a urethane layer, and an acrylic resin layer. Examples of the interposed layer 40 that is a porous body layer include foam layers. Specifically, examples of the interposed layer 40 that is a porous body layer and a resin layer include an ethylene propylene rubber foam layer, a butyl rubber foam layer, a nitrile rubber foam layer, a natural rubber foam layer, a styrene-butadiene rubber foam layer, a silicone foam layer, and a urethane foam layer. Examples of the interposed layer 40 that is not a porous body layer but a resin layer include acrylic resin layers. Examples of the interposed layer 40 that is not a resin layer but a porous body layer include porous metal body layers. The term "resin layer" as used herein refers to a resin-including layer. The term "resin layer" as used herein refers to a layer that may include a resin in an amount of 30% or more, in an amount of 45% or more, in an amount of 60% or more, or in an amount of 80% or more. The same applies to, for example, a rubber layer, an elastomer layer, an ethylene propylene rubber layer, a butyl rubber layer, a nitrile rubber layer, a natural rubber layer, a styrene-butadiene rubber layer, a silicone layer, an urethane layer, an acrylic resin layer, a metal layer, a resin film, and a ceramic film. The interposed layer 40 may be a blended layer including two or more materials.

The elastic modulus of the interposed layer 40 is, for example, 10000 N/m$^2$ to 10000000 N/m$^2$, and may be 20000 N/m$^2$ to 100000 N/m$^2$.

In an example, the pore diameter of the interposed layer 40 that is a porous body layer is 0.1 mm to 7.0 mm, and may be 0.3 mm to 5.0 mm. In another example, the pore diameter of the interposed layer 40 that is a porous body layer is, for example, 0.1 mm to 2.5 mm, and may be 0.2 mm to 1.5 mm or 0.3 mm to 0.7 mm. The porosity of the interposed layer 40 that is a porous body layer is, for example, 70% to 99%, and may be 80% to 99% or 90% to 95%.

A known foam (for example, the foam used in Patent Literature 2) can be used as the interposed layer 40 that is a foam layer. The interposed layer 40 that is a foam layer may have an open-cell structure, a closed-cell structure, or a semi-open-/semi-closed-cell structure. The term "open-cell structure" refers to a structure having an open cell rate of 100%. The term "closed-cell structure" refers to a structure having an open cell rate of 0%. The term "semi-open-/semi-closed-cell structure" refers to a structure having an open cell rate of greater than 0% and less than 100%. The open cell rate can be calculated, for example, using the following equation after a test in which a foam layer is sunk in water: open cell rate (%)={(volume of absorbed water)/(volume of cell part)}×100. In a specific example, the "volume of absorbed water" can be obtained by sinking and leaving a foam layer in water under a reduced pressure of −750 mmHg for 3 minutes, measuring the mass of water having replaced the air in cells of the foam layer, and converting the mass of water in the cells into volume on the assumption that the density of water is 1.0 g/cm$^3$. The term "volume of cell part" refers to a value calculated using the following equation: volume of cell part (cm$^3$)={(mass of foam layer)/(apparent density of foam layer)}−{(mass of foam layer)/(density of material)}. The term "density of material" refers to the density of a matrix (solid, or non-hollow, body) forming the foam layer.

The foaming factor (the ratio between the density before foaming and that after foaming) of the interposed layer 40 that is a foam layer is, for example, 5 to 40, and may be 10 to 40.

The interposed layer 40 in an uncompressed state has a thickness of, for example, 0.1 mm to 30 mm, and may have a thickness of 1 mm to 30 mm, 1.5 mm to 30 mm, or 2 mm to 25 mm. The interposed layer 40 in an uncompressed state is typically thicker than the piezoelectric film 35 in an uncompressed state. The thickness of the interposed layer 40 in an uncompressed state is, for example, 3 or more times the thickness of the piezoelectric film 35 in an uncompressed state, and may be 10 or more times or 30 or more times the thickness of the piezoelectric film 35 in an uncompressed state. The interposed layer 40 in an uncompressed state is typically thicker than the first joining layer 51 in an uncompressed state.

The first joining layer 51 is a layer having pressure-sensitive adhesiveness or adhesiveness. In other words, the first joining layer 51 is an adhesive layer or a pressure-sensitive adhesive layer. The first joining layer 51 can be stuck to a support. In the example of FIG. 1, the first joining layer 51 is in contact with the interposed layer 40. The first joining layer 51 is used to join the interposed layer 40 to a support. Specifically, the first joining layer 51 has a first joining face 17 to be stuck to a support. Examples of the first joining layer 51 include a double-faced tape including a substrate and a pressure-sensitive adhesive applied to the both sides of the substrate. Examples of the substrate of the double-faced tape used as the first joining layer 51 include non-woven fabric. Examples of the pressure-sensitive adhesive of the double-faced tape used as the first joining layer 51 include pressure-sensitive adhesives including an acrylic resin. The first joining layer 51 may be a layer including no substrate and formed of a pressure-sensitive adhesive.

The thickness of the first joining layer 51 is, for example, 0.01 mm to 1.0 mm, and may be 0.05 mm to 0.5 mm.

The second joining layer 52 is disposed between the interposed layer 40 and the piezoelectric film 35. In the present embodiment, the second joining layer 52 is a layer having pressure-sensitive adhesiveness or adhesiveness. In other words, the second joining layer 52 is an adhesive layer or a pressure-sensitive adhesive layer. The second joining layer 52 is in contact with the interposed layer 40 and the piezoelectric film 35. The second joining layer 52 joins the interposed layer 40 and the piezoelectric film 35. Examples of the second joining layer 52 include a double-faced tape including a substrate and a pressure-sensitive adhesive applied to the both sides of the substrate. Examples of the substrate of the double-faced tape used as the second joining layer 52 include non-woven fabric. Examples of the pressure-sensitive adhesive of the double-faced tape used as the second joining layer 52 include pressure-sensitive adhesives including an acrylic resin. The second joining layer 52 may be a layer including no substrate and formed of a pressure-sensitive adhesive.

The thickness of the second joining layer 52 is, for example, 0.01 mm to 1.0 mm, and may be 0.05 mm to 0.5 mm.

In the present embodiment, the piezoelectric film 35 is integrated with the layers on the first joining face 17 side by bringing the second joining layer 52 into contact with the piezoelectric film 35.

Figure 3:
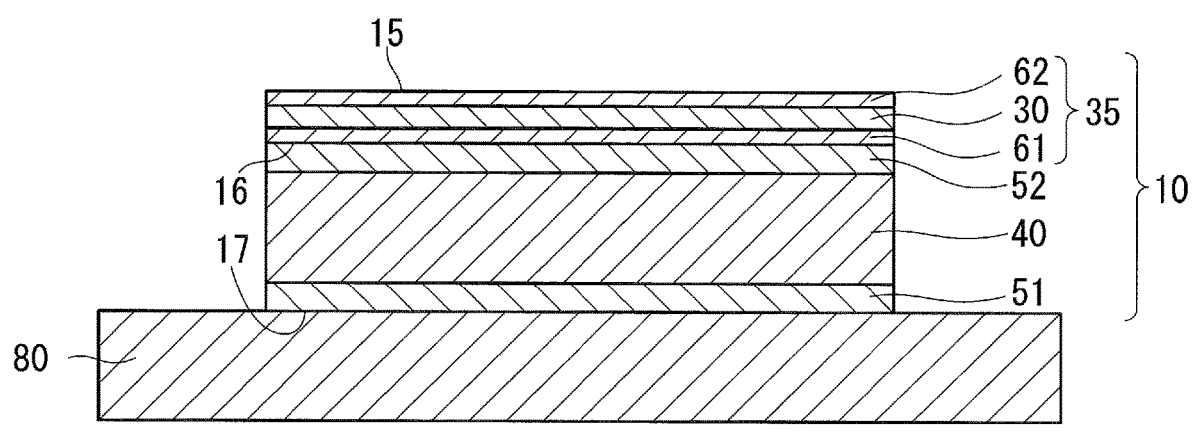
FIG. 3 illustrates a piezoelectric speaker fixed to a support.

A structure in which the piezoelectric speaker 10 of FIG. 1 is stuck to a support 80 with the aid of the first joining face 17 is shown in FIG. 3. In this state, voltage is applied to the piezoelectric film 35 through the lead wires. This vibrates the piezoelectric film 35, and thus sound is emitted from the piezoelectric film 35. In the example in FIG. 3, the support 80 has a flat surface, the piezoelectric speaker 10 is stuck to the flat surface, and the piezoelectric film 35 is extended flat thereon. This implementation is advantageous in that a sound wave radiated from the piezoelectric film 35 is close to a plane wave. When the support 80 has a curved surface, the piezoelectric speaker 10 may be stuck onto the curved surface.

The area of a surface of the support 80, the surface facing the first joining face 17, is typically equal to or greater than the area of the first joining face 17. The former area is, for example, 1.0 or more times greater than the latter area, and may be 1.5 or more times or 5 or more times greater than the latter area. The support 80 typically has a high stiffness (a product of Young's modulus and the second moment of area), a high Young's modulus, and/or a great thickness, compared to the interposed layer 40. The support 80 may have the same stiffness, Young's modulus, and/or thickness as that of the interposed layer 40, or may have a lower stiffness, a lower Young's modulus, and/or a smaller thickness than that of the interposed layer 40. The support 80 has a Young's modulus of, for example, 1 GPa or more, and may have a Young's modulus of 10 GPa or more or 50 GPa or more. The upper limit of the Young's modulus of the support 80 is, for example, but not particularly limited to, 1000 GPa. Since various articles can be employed as the support 80, it is difficult to define the range of the thickness thereof. The thickness of the support 80 is, for example, 0.1 mm or more, and may be 1 mm or more, 10 mm or more, or 50 mm or more. The upper limit of thickness of the support 80 is, for example, but not particularly limited to, 1 m. The position and/or the shape of the support 80 typically does not vary depending on the piezoelectric speaker 10. The support 80 is typically produced on the assumption that the support 80 is not bent.

The piezoelectric speaker 10 fixed to the support 80 can be used as an acoustic speaker and as a speaker for sound reduction.

In the piezoelectric speaker 10, both principal surfaces of the piezoelectric film 35 vibrate up and down as a whole. The piezoelectric speaker 10 as described above can exhibit practical acoustic characteristics even when the piezoelectric film 35 is not kept in a curved shape.

Specifically, both principal surfaces of the piezoelectric film 35 vibrate up and down as a whole when voltage is applied between the first electrode 61 and the second electrode 62 with the entire first joining face 17 stuck to the support 80, the entire first joining face 17 being a principal surface of the first joining layer 51, the principal surface being opposite to the interposed layer 40. That a principal surface vibrates up and down as a whole means that the principal surface vibrates so as to be displaced to two opposite sides in a thickness direction of the piezoelectric film 35 with reference to the position at which the principal surface lies when voltage is not applied between the first electrode 61 and the second electrode 62.

That "both principal surfaces of the piezoelectric film 35 vibrate up and down as a whole" is a concept including not only the case where the completely entire regions of both principal surfaces vibrate but also the case where substantially entire regions of both principal surfaces vibrate. Specifically, that "both principal surfaces of the piezoelectric film 35 vibrate up and down as a whole" means that a region accounting for 90% or more of the area of one surface (a supported face 16) of both principal surfaces vibrates up and down and a region accounting for 90% or more of the area of the other surface of both principal surfaces vibrates up and down. A region accounting for 95% or more of the area of the one surface may vibrate up and down, or a region accounting for 100% of the area of the one surface may vibrate up and down. A region accounting for 95% or more of the area of the other surface may vibrate up and down, or a region accounting for 100% of the area of the other surface may vibrate up and down.

An outer edge of the one surface of the piezoelectric film 35 has a closed outline. Typically, a portion accounting for 90% or more of the closed outline vibrates up and down. A portion accounting for 95% or more of the closed outline may vibrate up and down, or a portion accounting for 100% of the closed outline may vibrate up and down.

An outer edge of the other surface of the piezoelectric film 35 has a closed outline. Typically, a portion accounting for 90% or more of the closed outline vibrates up and down. A portion accounting for 95% or more of the closed outline may vibrate up and down, or a portion accounting for 100% of the closed outline may vibrate up and down.

Typically, the piezoelectric speaker 10 does not include a fixing member (such as a screw or a self-tightening member tightened by swaging) that fixes a portion of the piezoelectric film 35 to the support 80 and that allows the portion to function as a node of vibration of the piezoelectric film 35 when voltage is applied between the first electrode 61 and the second electrode 62 with the entire first joining face 17 stuck to the support 80.

In a non-limiting embodiment, the principal surface on the piezoelectric film 35 side of the interposed layer 40 vibrates up and down as a whole. Specifically, the principal surface on the piezoelectric film 35 side of the interposed layer 40 vibrates up and down as a whole when voltage is applied between the first electrode 61 and the second electrode 62 with the entire first joining face 17 stuck to the support 80.

That "the principal surface on the piezoelectric film 35 side of the interposed layer 40 vibrates up and down as a whole" is a concept including not only the case where the completely entire region of the principal surface vibrates but also the case where a substantially entire region of the principal surface vibrates. Specifically, that "the principal surface on the piezoelectric film 35 side of the interposed layer 40 vibrates up and down as a whole" means that a region accounting for 90% or more of the area of the principal surface vibrates up and down. A region accounting for 95% or more of the area of the principal surface may vibrate up and down, or a region accounting for 100% of the area of the principal surface may vibrate up and down.

Figure 4A:
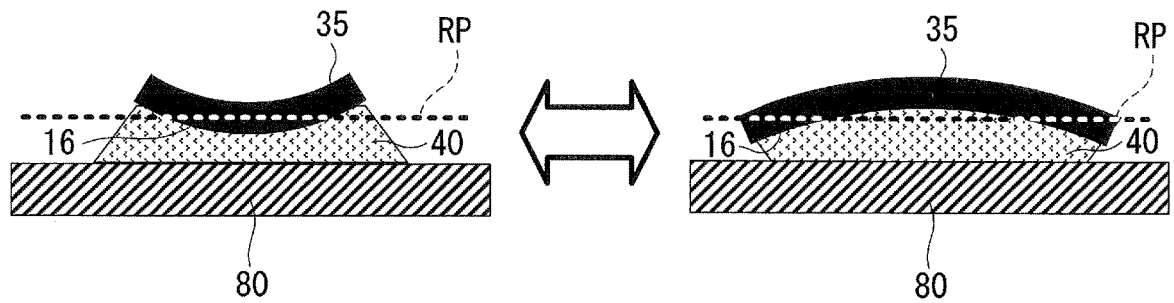
FIG. 4A schematically shows how a piezoelectric speaker vibrates.
Figure 4B:
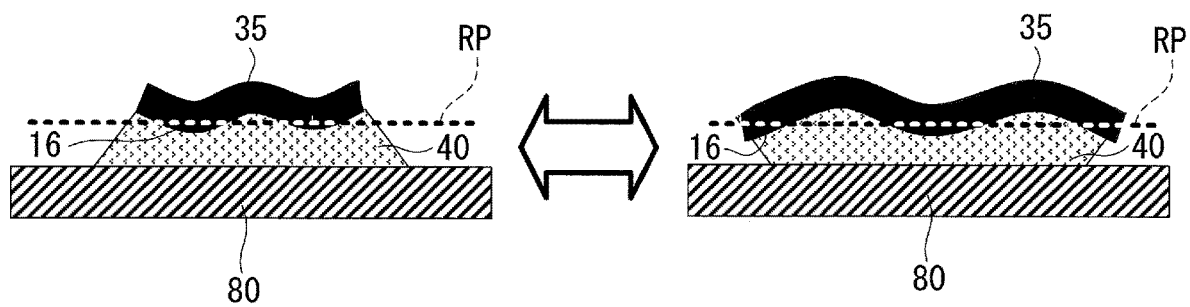
FIG. 4B schematically shows how a piezoelectric speaker vibrates.

How the piezoelectric film 35 vibrates will be described with reference to FIGS. 4A and 4B. In FIGS. 4A and 4B, a reference position RP represents the position of the supported face 16 of the piezoelectric film 35 in a resting state. The supported face 16 refers to the principal surface on the interposed layer 40 side of the piezoelectric film 35. The first joining layer 51 and the second joining layer 52 are not illustrated in FIGS. 4A and 4B. In the description using FIGS. 4A and 4B, the term "thickness direction" refers to a thickness direction of the piezoelectric film 35 in a resting state, and the term "in-plane direction" refers to a direction perpendicular to the thickness direction.

FIG. 4A shows the piezoelectric film 35 vibrating at a relatively low frequency.

In the example shown in FIG. 4A, the piezoelectric film 35 is in the state shown on the left side of the block arrow at a certain moment. In this state, a central region, which is defined in the in-plane direction, of the supported face 16 of the piezoelectric film 35 is displaced to the support 80 side with respect to the reference position RP, and an outer region of the supported face 16 of the piezoelectric film 35 is displaced to the side opposite to the support 80 with respect to the reference position RP. A principal surface of the piezoelectric film 35, the principal surface being opposite to the supported face 16, is also displaced in the same manner with reference to the position of the principal surface in a resting state.

In the example shown in FIG. 4A, the piezoelectric film 35 is in the state shown on the right side of the block arrow at a different moment. In this state, the central region, which is defined in the in-plane direction, of the supported face 16 of the piezoelectric film 35 is displaced to the side opposite to the support 80 with respect to the reference position RP, and the outer region of the supported face 16 of the piezoelectric film 35 is displaced to the support 80 side with respect to the reference position RP. A principal surface of the piezoelectric film 35, the principal surface being opposite to the supported face 16, is also displaced in the same manner with reference to the position of the principal surface in a resting state.

FIG. 4B shows the piezoelectric film 35 vibrating at a relatively high frequency.

In the example shown in FIG. 4B, the piezoelectric film 35 is in the state shown on the left side of the block arrow at a certain moment. In this state, a portion where the supported face 16 is displaced to the side opposite to the support 80 with respect to the reference position RP, a portion where the supported face 16 is displaced to the support 80 side with respect to the reference position RP, a portion where the supported face 16 is displaced to the side opposite to the support 80 with respect to the reference position RP, a portion where the supported face 16 is displaced to the support 80 side with respect to the reference position RP, and a portion where the supported face 16 is displaced to the side opposite to the support 80 with respect to the reference position RP are arranged in this order along the in-plane direction of the piezoelectric film 35. A principal surface of the piezoelectric film 35, the principal surface being opposite to the supported face 16, is also displaced in the same manner with reference to the position of the principal surface in a resting state.

In the example shown in FIG. 4B, the piezoelectric film 35 is in the state shown on the right side of the block arrow at a different moment. In this state, a portion where the supported face 16 is displaced to the support 80 side with respect to the reference position RP, a portion where the supported face 16 is displaced to the side opposite to the support 80 with respect to the reference position RP, a portion where the supported face 16 is displaced to the support 80 side with respect to the reference position RP, a portion where the supported face 16 is displaced to the side opposite to the support 80 with respect to the reference position RP, and a portion where the supported face 16 is displaced to the support 80 side with respect to the reference position RP are arranged in this order along the in-plane direction of the piezoelectric film 35. A principal surface of the piezoelectric film 35, the principal surface being opposite to the supported face 16, is also displaced in the same manner with reference to the position of the principal surface in a resting state.

In the embodiments shown in FIGS. 4A and 4B, the principal surface on the piezoelectric film 35 side of the interposed layer 40 also vibrates up and down as a whole.

The piezoelectric film 35 whose both principal surfaces vibrate up and down as a whole is advantageous in that the piezoelectric film 35 exhibits practical acoustic characteristics. In the present embodiment, the interposed layer 40 is disposed between the piezoelectric film 35 and the first joining layer 51. The presence of the interposed layer 40 is thought to contribute to allowing the piezoelectric film 35 to exhibit practical acoustic characteristics. Hereinafter, the piezoelectric speaker 10 according to the present embodiment, including the interposed layer 40, will be further described.

In the present embodiment, the interposed layer 40 prevents difficulty in emitting lower-frequency sound in the audible range from increasing as a result of sticking the first joining face 17 of the piezoelectric speaker 10 to the support 80. It is likely that lower-frequency sound in the audible range is easily generated from the piezoelectric film 35 owing to the interposed layer 40 adequately holding one principal surface of the piezoelectric film 35, although the detail of the effect needs to be studied in the future.

It is thought that adequate holding, which is mentioned above, is achieved by appropriate selection of the holding degree of the interposed layer 40. The interposed layer 40 has a holding degree of, for example, $5 \times 10^8$ N/m³ or less. The interposed layer 40 has a holding degree of, for example, $1 \times 10^4$ N/m³ or more. The interposed layer 40 preferably has a holding degree of $2 \times 10^8$ N/m³ or less and more preferably $1 \times 10^5$ to $5 \times 10^7$ N/m³. The holding degree (N/m³) of the interposed layer 40 is a value obtained by dividing a product of the elastic modulus (N/m²) of the interposed layer 40 and the surface filling factor of the interposed layer 40 by the thickness (m) of the interposed layer 40, as represented by the following equation. The surface filling factor of the interposed layer 40 is the filling factor (a value obtained by subtracting the porosity from 1) of the principal surface on the piezoelectric film 35 side of the interposed layer 40. When pores of the interposed layer 40 are evenly distributed, the surface filling factor can be regarded as equal to a three-dimensionally determined filling factor of the interposed layer 40.

Holding degree (N/m³)=Elastic modulus (N/m²)× Surface filling factor÷Thickness (m)

The holding degree can be considered to be a parameter representing the degree of holding the piezoelectric film 35 by means of the interposed layer 40. The above equation indicates that the greater the elastic modulus of the interposed layer 40 is, the greater the degree of holding becomes. The above equation indicates that the greater the surface filling factor of the interposed layer 40 is, the greater the degree of holding becomes. The above equation indicates that the smaller the thickness of the interposed layer 40 is, the greater the degree of holding becomes. Although the relationship between the holding degree of the interposed layer 40 and sound generated from the piezoelectric film 35 needs to be studied in the future, it is likely that an excessively great holding degree prevents the piezoelectric film 35 from deforming, which is necessary to emit lower-frequency sound. On the other hand, when the holding degree is excessively small, it is likely that the piezoelectric film 35 does not sufficiently deform in its thickness direction and extends and contracts only in its in-plane direction (the direction perpendicular to the thickness direction) and thus generation of lower-frequency sound is prevented. It is thought that since the holding degree of the interposed layer 40 is set within an adequate range, extension and contraction of the piezoelectric film 35 in the in-plane direction is adequately converted into deformation thereof in the thickness direction and that results in appropriate bending of the piezoelectric film 35 as a whole and makes it easy to generate lower-frequency sound.

As can be understood from the above description, there may be a layer other than the interposed layer 40 between the piezoelectric film 35 and the first joining face 17. The other layer is, for example, a second pressure-sensitive adhesive layer 52.

The support 80 may have a greater holding degree than that of the interposed layer 40. In this case as well, lower-frequency sound can be generated from the piezoelectric film 35 because of the contribution of the interposed layer 40. The support 80 may have the same holding degree as that of the interposed layer 40, or may have a smaller holding degree than that of the interposed layer 40. The holding degree (N/m³) of the support 80 is a value obtained by dividing a product of the elastic modulus (N/m²) of the support 80 and the surface filling factor of the support 80 by the thickness (m) of the support 80. The surface filling factor of the support 80 is the filling factor (a value obtained by subtracting the porosity from 1) of the principal surface on the piezoelectric film 35 side of the support 80.

In the piezoelectric speaker 10 of the present embodiment, both the interposed layer 40 and the first joining layer 51 support the entire supported face 16.

That "both the interposed layer 40 and the first joining layer 51 support the entire supported face 16" is a concept including not only the case where both the interposed layer 40 and the first joining layer 51 support the completely entire region of the supported face 16 but also the case where both the interposed layer 40 and the first joining layer 51 support a substantially entire region of the supported face 16. Specifically, that "both the interposed layer 40 and the first joining layer 51 support the entire supported face 16" means that the interposed layer 40 supports a region accounting for 90% or more of the area of the supported face 16 and the first joining layer 51 supports a region accounting for 90% or more of the area of the supported face 16. The interposed layer 40 may support a region accounting for 95% or more of the area of the supported face 16, or the interposed layer 40 may support a region accounting for 100% of the area of the supported face 16. The first joining layer 51 may support a region accounting for 95% or more of the area of the supported face 16, or the first joining layer 51 may support a region accounting for 100% of the area of the supported face 16.

The above piezoelectric speaker 10 is easily stuck to the support 80. The above piezoelectric speaker 10 can exhibit practical acoustic characteristics when stuck to the support 80.

In the present embodiment, when voltage is applied between the first electrode 61 and the second electrode 62 with the first joining layer 51 stuck to the support 80, the interposed layer 40 and the first joining layer 51 withstand vibration of the piezoelectric film 35 and support the entire supported face 16.

In the present embodiment, the interposed layer 40 is joined to the entire supported face 16. Specifically, the second joining layer 52 joins the entire supported face 16 to the interposed layer 40. More specifically, the second joining layer 52 is in contact with the entire supported face 16. When voltage is applied between the first electrode 61 and the second electrode 62 with the first joining layer 51 stuck to the support 80, the piezoelectric film 35 vibrates with the entire supported face 16 joined to the interposed layer 40 with the aid of the second joining layer 52.

The piezoelectric speaker 10 according to the present invention can be interpreted as follows.

A piezoelectric speaker 10, including:
a first electrode 61;
a second electrode 62;
a piezoelectric film 35 including a piezoelectric body 30 sandwiched by the first electrode 61 and the second electrode 62;
a first joining layer 51 having pressure-sensitive adhesiveness or adhesiveness; and
an interposed layer 40 disposed between the piezoelectric film 35 and the first joining layer 51, wherein
when a principal surface of the piezoelectric film 35, the principal surface on a side of the interposed layer 40, is defined as a supported face 16, the interposed layer 40 is joined to the entire supported face 16.

The piezoelectric speaker 10 as described above can exhibit practical acoustic characteristics even when the piezoelectric film 35 is not kept in a curved shape.

That "the interposed layer 40 is joined to the entire supported face 16" is a concept including not only the case where the interposed layer 40 is joined to the completely entire region of the supported face 16 but also the case where the interposed layer 40 is joined to a substantially entire region of the supported face 16. Specifically, that "the interposed layer 40 is joined to the entire supported face 16" means that the interposed layer 40 is joined to a region accounting for 90% or more of the area of the supported face 16. The interposed layer 40 may be joined to a region accounting for 95% or more of the area of the supported face 16, or may be joined to a region accounting for 100% of the supported face 16. Likewise, in the context of the sentence "the second joining layer 52 joins the entire supported face 16 to the interposed layer 40" as well, "the entire supported face 16" can be interpreted as a region accounting for 90% or more of the area of the supported face 16, a region accounting for 95% or more of the area of the supported face 16, or a region accounting for 100% of the area of the supported face 16.

Likewise, that "the second joining layer 52 is in contact with the entire supported face 16" is a concept including not only the case where the second joining layer 52 is in contact with the completely entire region of the supported face 16 but also the case where the second joining layer 52 is in contact with a substantially entire region of the supported face 16. Specifically, that "the second joining layer 52 is in contact with the entire supported face 16" means that the second joining layer 52 is in contact with a region accounting for 90% or more of the area of the entire supported face 16. The second joining layer 52 may be in contact with a region accounting for 95% or more of the area of the entire supported face 16, or may be in contact with a region accounting for 100% of the area of the entire supported face 16.

As can be understood from the above description, in the piezoelectric speaker 10, the interposed layer 40 may be disposed on a region accounting for 90% or more of the area of the piezoelectric film 35, on a region accounting for 95% or more of the area of the piezoelectric film 35, or on a region accounting for 100% of the area of the piezoelectric film 35 when the piezoelectric film 35 is viewed in plan. The first joining layer 51 may be disposed on a region accounting for 90% or more of the area of the piezoelectric film 35, on a region accounting for 95% or more of the area of the piezoelectric film 35, or on a region accounting for 100% of the area of the piezoelectric film 35 when the piezoelectric film 35 is viewed in plan. Furthermore, the second joining layer 52 may be disposed on a region accounting for 90% or more of the area of the piezoelectric film 35, on a region accounting for 95% or more of the area of the piezoelectric film 35, or on a region accounting for 100% of the area of the piezoelectric film 35 when the piezoelectric film 35 is viewed in plan.

When the interposed layer 40 is a porous body, the rate of the region where the interposed layer 40 is disposed is not defined from a microscopical perspective in consideration of pores in the porous structure of the interposed layer 40, but rather from a relatively macroscopic perspective. For example, when the piezoelectric film 35 and the interposed layer 40 that is a porous body are plate-like bodies having the same outline in plan, the interposed layer 40 is described as being disposed on a region accounting for 100% of the area of the piezoelectric film 35. 50% or more of a principal surface 15 of the piezoelectric speaker 10, the principal surface 15 being opposite to the first joining face 17, can be composed of the piezoelectric film 35. 75% or more of the principal surface 15 may be composed of the piezoelectric film 35, or the entire principal surface 15 may be composed of the piezoelectric film 35.

In the present embodiment, layers located between the piezoelectric film 35 and the first joining face 17 and adjacent to each other are joined together. The location between the piezoelectric film 35 and the first joining face 17 includes the piezoelectric film 35 and the first joining face 17. Specifically, the first joining layer 51 and the interposed layer 40 are joined together, the interposed layer 40 and the second joining layer 52 are joined together, and the second joining layer 52 and the piezoelectric film 35 are joined together. This allows the piezoelectric film 35 to be stably disposed regardless of the orientation in which the piezoelectric speaker 10 is attached to the support 80. This also makes it easy to attach the piezoelectric speaker 10 to the support 80. Moreover, because of the contribution of the interposed layer 40, sound is emitted from the piezoelectric film 35 regardless of the orientation in which the piezoelectric speaker 10 is attached. Thus, in the present embodiment, the combination of these allows achievement of the piezoelectric speaker 10 of high usability.

In the present embodiment, the first joining layer 51 has a uniform thickness. The interposed layer 40 has a uniform thickness. The piezoelectric film 35 has a uniform thickness. Their having uniform thicknesses is often advantageous from various points of view, for example, in view of storage of the piezoelectric speaker 10, the usability thereof, and control of sound emitted from the piezoelectric film 35. "Having a uniform thickness" refers to, for example, having the smallest thickness which is 70% or more and 100% or less of the largest thickness. The smallest thickness of each of the first joining layer 51, the interposed layer 40, and the piezoelectric film 35 may be 85% or more and 100% or less of the largest thickness. The smallest thickness of each of the first joining layer 51, the interposed layer 40, and the piezoelectric film 35 may be 90% or more and 100% or less of the largest thickness. "Having a uniform thickness" also refers to having a uniform thickness in a resting state.

In the example shown in FIG. 1, the first joining face 17 of the first joining layer 51 is a bare surface. The first joining face 17 may be covered by a release layer capable of being separated from the first joining face 17. Typically, the release layer covers a region accounting for 100% of the area of the first joining face 17. The release layer, for example, includes a film and a release agent applied to the principal surface on the first joining face 17 side of the film. Examples of the film of the release layer include paper and resin films. Examples of the release agent of the release layer include polymers having a long-chain alkyl group, fluorine-containing compounds and polymers, and silicone polymers. The piezoelectric film 35 and the interposed layer 40 are allowed to be fixed to the support 80 by sticking the first joining face 17 from which the release layer has been removed to the support 80. Such a sticking procedure is less troublesome to a person who does the procedure.

Resin is a material less likely to be cracked than, for example, ceramics. In a specific example, the piezoelectric body 30 of the piezoelectric film 35 is a resin film and the interposed layer 40 is a resin layer not functioning as a piezoelectric film. This specific example is advantageous in that the piezoelectric speaker 10 is cut, for example, with scissors or by hand without cracking the piezoelectric body 30 or the interposed layer 40. Additionally, in this specific example, the piezoelectric body 30 or the interposed layer 40 is unlikely to be cracked by bending the piezoelectric speaker 10. Moreover, that the piezoelectric body 30 is a resin film and the interposed layer 40 is a resin layer is advantageous in that the piezoelectric speaker 10 is fixed onto a curved surface without cracking the piezoelectric body 30 or the interposed layer 40.

In the example in FIG. 1, the piezoelectric film 35, the interposed layer 40, the first joining layer 51, and the second joining layer 52 are each a rectangle having a short side and a long side when viewed in plan. The piezoelectric film 35, the interposed layer 40, the first joining 51, and the second joining layer 52 each may be, for example, a square, a circle, or an oval.

The piezoelectric speaker may also include a layer other than the layers shown in FIG. 1.

EXAMPLES

The present invention will be described in detail using Examples. It should be noted that Examples given below are only illustrative of the present invention and do not limit the present invention.

Example 1

A first joining face 17 of a piezoelectric speaker 10 was stuck to a supporting member fixed. A structure in which the supporting member is used as a support 80 as in FIG. 3 was thus produced. Specifically, a 5-mm-thick stainless steel plate (SUS plate) was used as the supporting member. A 0.16-mm-thick pressure-sensitive adhesive sheet (double-faced tape) including non-woven fabric both sides of which were impregnated with an acrylic adhesive was used as the first joining layer 51. A 3-mm-thick closed-cell foam obtained by foaming a mixture including ethylene propylene rubber and butyl rubber by a foaming factor of about 10 was used as the interposed layer 40. A 0.15-mm-thick pressure-sensitive adhesive sheet (double-faced tape) including non-woven fabric as a substrate to the both sides of which a pressure-sensitive adhesive including a solventless acrylic resin was applied was used as the second joining layer 52. A polyvinylidene fluoride film on each side of which a copper electrode (including nickel) was vapor-deposited (total thickness: 33 µm) was used as the piezoelectric film 35. The first joining layer 51, the interposed layer 40, the second joining layer 52, and the piezoelectric film 35 of Example 1 each have dimensions of 37.5 mm long by 37.5 mm wide when viewed in plan, each have the shape of a plate which is neither divided nor frame-shaped, and have outlines overlapping when viewed in plan. (The same applies to Examples and Reference Example described later.) The supporting member 80 has dimensions of 50 mm long by 50 mm wide when viewed in plan and covers the entire first joining layer 51. A sample of Example 1 having a structure as shown in FIG. 3 was produced in this manner.

Example 2

A 3-mm-thick semi-open-/semi-closed-cell foam obtained by foaming a mixture including ethylene propylene rubber by a foaming factor of about 10 was used as an interposed layer 40. This foam includes sulfur. Except for that, a sample of Example 2 was produced in the same manner as in Example 1.

Example 3

A 5-mm-thick foam formed of the same material and having the same configuration as those of the interposed layer 40 of Example 2 was used as an interposed layer 40 in Example 3. Except for that, a sample of Example 3 was produced in the same manner as in Example 2.

Example 4

A 10-mm-thick foam formed of the same material and having the same configuration as those of the interposed layer 40 of Example 2 was used as an interposed layer 40 in Example 4. Except for that, a sample of Example 4 was produced in the same manner as in Example 2.

Example 5

A 20-mm-thick foam formed of the same material and having the same configuration as those of the interposed layer 40 of Example 2 was used as an interposed layer 40 in Example 5. Except for that, a sample of Example 5 was produced in the same manner as in Example 2.

Example 6

A 20-mm-thick semi-open-/semi-closed-cell foam obtained by foaming a mixture including ethylene propylene rubber by a foaming factor of about 10 was used as an interposed layer 40. This foam does not include sulfur and is more flexible than the foams used as the interposed layers 40 of Examples 2 to 5. Except for that, a sample of Example 6 was produced in the same manner as in Example 1.

Example 7

A 20-mm-thick semi-open-/semi-closed-cell foam obtained by foaming a mixture including ethylene propylene rubber by a foaming factor of about 20 was used as an interposed layer 40. Except for that, a sample of Example 7 was produced in the same manner as in Example 1.

Example 8

A porous metal body was used as an interposed layer 40. This porous metal body is made of nickel and has a pore diameter of 0.9 mm and a thickness of 2.0 mm. A pressure-sensitive adhesive layer same as a first joining layer 51 as used in Example 1 was used as a second joining layer 52. Except for those, a sample of Example 8 was produced in the same manner as in Example 1.

Example 9

A 3-mm-thick substrate-less pressure-sensitive adhesive sheet formed of an acrylic pressure-sensitive adhesive was used as an interposed layer 40. Except for that, a sample of Example 9 was produced in the same manner as in Example 8.

Example 10

A 5-mm-thick urethane foam was used as an interposed layer 40. Except for that, a sample of Example 10 was produced in the same manner as in Example 8.

Example 11

A 10-mm-thick urethane foam was used as an interposed layer 40. This urethane foam has a smaller pore diameter than that of the urethane foam used as the interposed layer 40 of Example 10. Except for that, a sample of Example 11 was produced in the same manner as in Example 8.

Example 12

A 5-mm-thick closed-cell acrylonitrile butadiene rubber foam was used as an interposed layer 40. Except for that, a sample of Example 12 was produced in the same manner as in Example 8.

Example 13

A 5-mm-thick closed-cell ethylene propylene rubber foam was used as an interposed layer 40. Except for that, a sample of Example 13 was produced in the same manner as in Example 8.

Example 14

A 5-mm-thick closed-cell foam in which natural rubber and styrene-butadiene rubber are blended was used as an interposed layer 40. Except for that, a sample of Example 14 was produced in the same manner as in Example 8.

Example 15

A 5-mm-thick closed-cell silicone foam was used as an interposed layer 40. Except for that, a sample of Example 15 was produced in the same manner as in Example 8.

Example 16

A 10-mm-thick foam formed of the same materials and having the same configuration as those of the interposed layer 40 of Example 1 was used as an interposed layer 40. A pressure-sensitive adhesive sheet same as the one used as the second joining layer 52 in Example 1 was used as a second joining layer 52. A 35-μm-thick resin sheet including a corn-derived polylactic acid as a main raw material was used as a piezoelectric body 30 of a piezoelectric film 35. A first electrode 61 and a second electrode 62 of the piezoelectric film 35 are each formed of a 0.1-μm-thick aluminum film and were formed by vapor deposition. A piezoelectric film 35 having a total thickness of 35.2 μm was thus obtained. Except for those, a sample of Example 16 was produced in the same manner as in Example 1.

Reference Example 1

A piezoelectric film 35 as used in Example 1 was employed as a sample of Reference Example 1. In Reference Example 1, the sample was placed on a board parallel to the ground without being adhered to the board.

The methods for evaluation of the samples according to Examples and Reference Example are as follows.

<Thickness of Interposed Layer (Uncompressed State)>

The thickness of each of the interposed layers was measured using a thickness gauge.

<Elastic Modulus of Interposed Layer>

A small piece was cut out from each of the interposed layers. The small piece was subjected to a compression test at ordinary temperature using a tensile tester ("RSA-G2" manufactured by TA Instruments). A stress-strain curve was thus obtained. The elastic modulus was calculated from the initial slope of the stress-strain curve.

<Pore Diameter of Interposed Layer>

An enlarged image of each of the interposed layers was obtained using a microscope. The average of the pore diameters of the interposed layer was determined by image analysis of the enlarged image. The average thus determined was employed as the pore diameter of the interposed layer.

<Porosity of Interposed Layer>

A small rectangular cuboid piece was cut out from each of the interposed layers. The apparent density was determined from the volume and the mass of the small rectangular cuboid piece. The apparent density was divided by the density of a matrix (solid, or non-hollow, body) forming the interposed layer. The filling factor was thus calculated. Then, the filling factor was subtracted from 1. The porosity was thus obtained.

<Surface Filling Factor of Interposed Layer>

For Examples 2 to 15, the filling factor calculated as above is employed as the surface filling factor. For Examples 1 and 16, the surface filling factor is 100% because the interposed layers have a surface skin layer.

<Frequency Characteristics of Sample in Terms of Sound Pressure Level>

Figure 5:
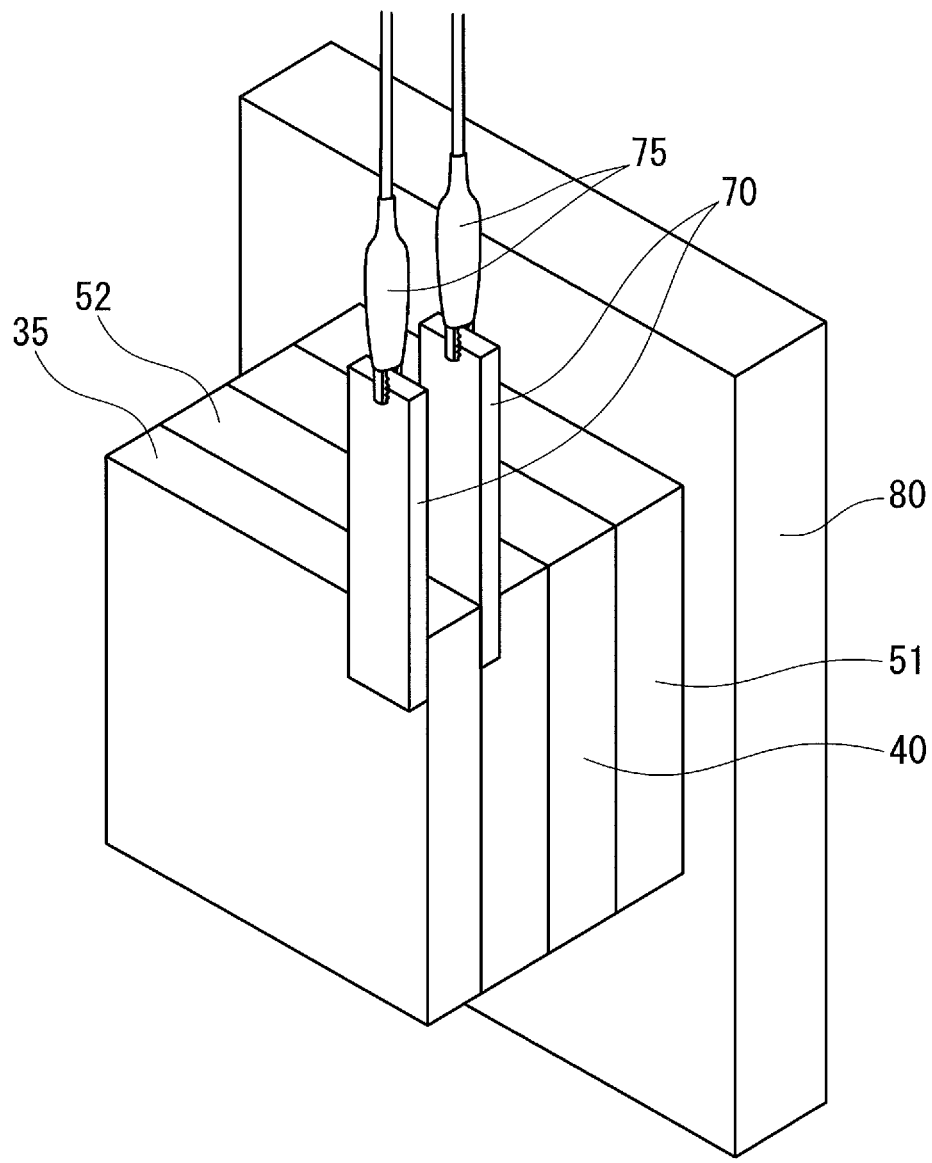
FIG. 5 illustrates a structure for measurement of a sample.

A structure for measurement of the samples of Examples 1 to 16 is shown in FIG. 5. An electrically conductive copper foil tape 70 (CU-35C manufactured by 3M) having dimensions of 70 μm thick by 5 mm long by 70 mm wide was attached to a corner of each side of the piezoelectric film 35. An alligator clip 75 with a cover was attached to each of the electrically conductive copper foil tapes 70. The electrically conductive copper foil tapes 70 and the alligator clips 75 with covers compose a portion of an electrical pathway used for application of AC voltage to the piezoelectric film 35.

A structure for measurement of the sample of Reference Example 1 is based on the structure of FIG. 5. Specifically, as in FIG. 5, an electrically conductive copper foil tape 70 was attached to a corner of each side of the piezoelectric film 35, and an alligator clip 75 with a cover was attached to each of the tapes 70. The resulting assembly was placed on a board parallel to the ground without being adhered to the board.

Figure 6:
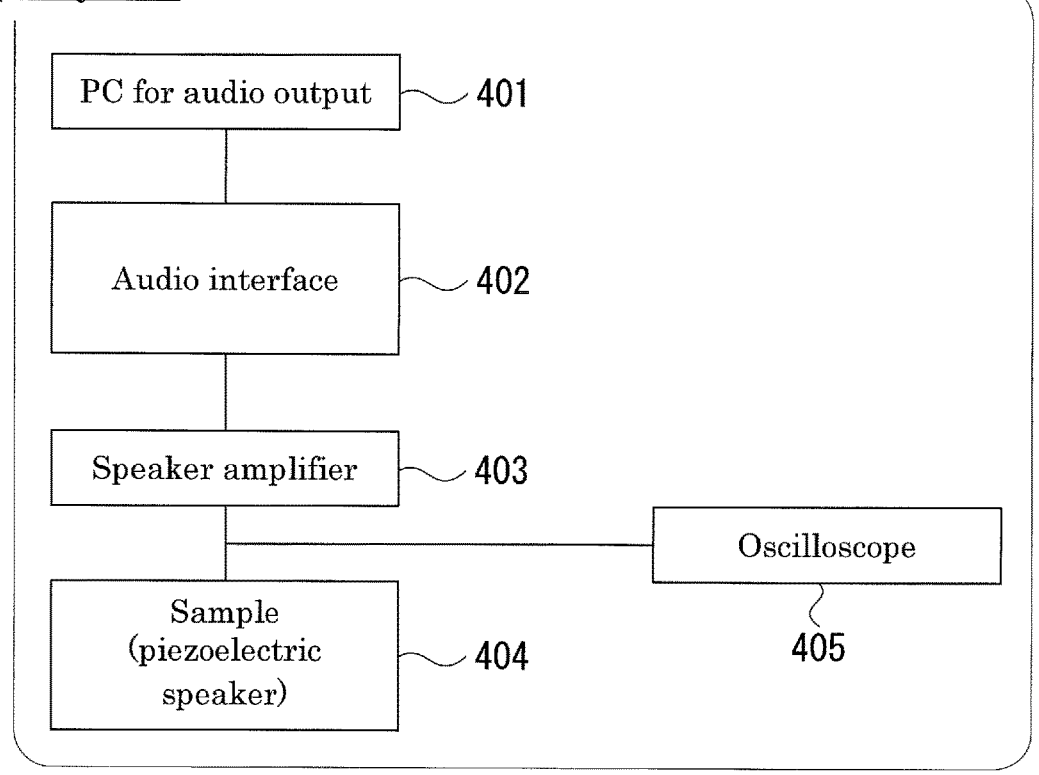
FIG. 6 is a block diagram of an output system.
Figure 7:
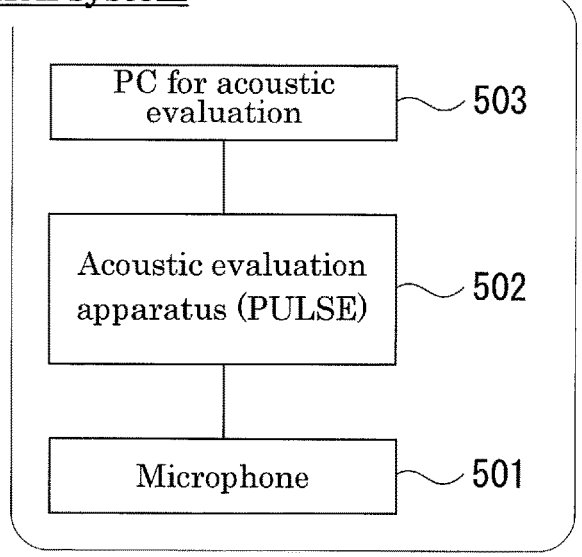
FIG. 7 is a block diagram of an evaluation system.

Block diagrams for measurement of the acoustic characteristics of the samples are shown in FIG. 6 and FIG. 7. Specifically, an output system is shown in FIG. 6, and an evaluation system is shown in FIG. 7.

In the output system shown in FIG. 6, a personal computer (a personal computer may hereinafter be simply described as a PC) 401 for audio output, an audio interface 402, a speaker amplifier 403, a sample 404 (any of the piezoelectric speakers of Examples and Reference Example) were connected in this order. The speaker amplifier 403 was also connected to an oscilloscope 405 so that output from the speaker amplifier 403 to the sample 404 could be monitored.

WaveGene was installed in the PC 401 for audio output. WaveGene is free software for generation of a test audio signal. QUAD-CAPTURE manufactured by Roland Corporation was used as the audio interface 402. The sampling frequency of the audio interface 402 was set to 192 kHz. A-924 manufactured by Onkyo Corporation was used as the speaker amplifier 403. DPO2024 manufactured by Tektronix, Inc. was used as the oscilloscope 405.

In the evaluation system shown in FIG. 7, a microphone 501, an acoustic evaluation apparatus (PULSE) 502, and a PC 503 for acoustic evaluation were connected in this order.

Type 4939-C-002 manufactured by Bruel & Kjaer Sound & Vibration Measurement A/S was used as the microphone 501. The microphone 501 was disposed 1 m away from the sample 404. Type 3052-A-030 manufactured by Bruel & Kjaer Sound & Vibration Measurement A/S was used as the acoustic evaluation apparatus 502.

The output system and the evaluation system were configured in the above manners. AC voltage was applied from the PC 401 for audio output to the sample 404 via the audio interface 402 and the speaker amplifier 403. Specifically, a test audio signal whose frequency sweeps from 100 Hz to 100 kHz in 20 seconds was generated using the PC 401 for audio output. During this, voltage output from the speaker amplifier 403 was monitored using the oscilloscope 405. Additionally, sound generated from the sample 404 was evaluated using the evaluation system. A test for measurement of the sound pressure frequency characteristics was performed in this manner.

The details of the output system and evaluation system settings are as follows.

[Output System Settings]
  Frequency range: 100 Hz to 100 kHz
  Sweep time: 20 seconds
  Effective voltage: 10 V
  Output waveform: sine curve
  [Evaluation System Settings]
  Measurement time: 22 seconds
  Peak hold
  Measurement range: 4 Hz to 102.4 kHz
  Number of lines: 6400

<Determination of Frequency at Which Emission of Sound Starts>

The lower end of a frequency domain (exclusive of a sharp peak portion in which a frequency range where the sound pressure level is maintained higher than that of background noise by +3 dB or more falls within ±10% of a peak frequency (a frequency at which the sound pressure level reaches a peak)) where the sound pressure level is higher than that of background noise by 3 dB or more was determined as a frequency at which emission of sound starts.

Figure 9:
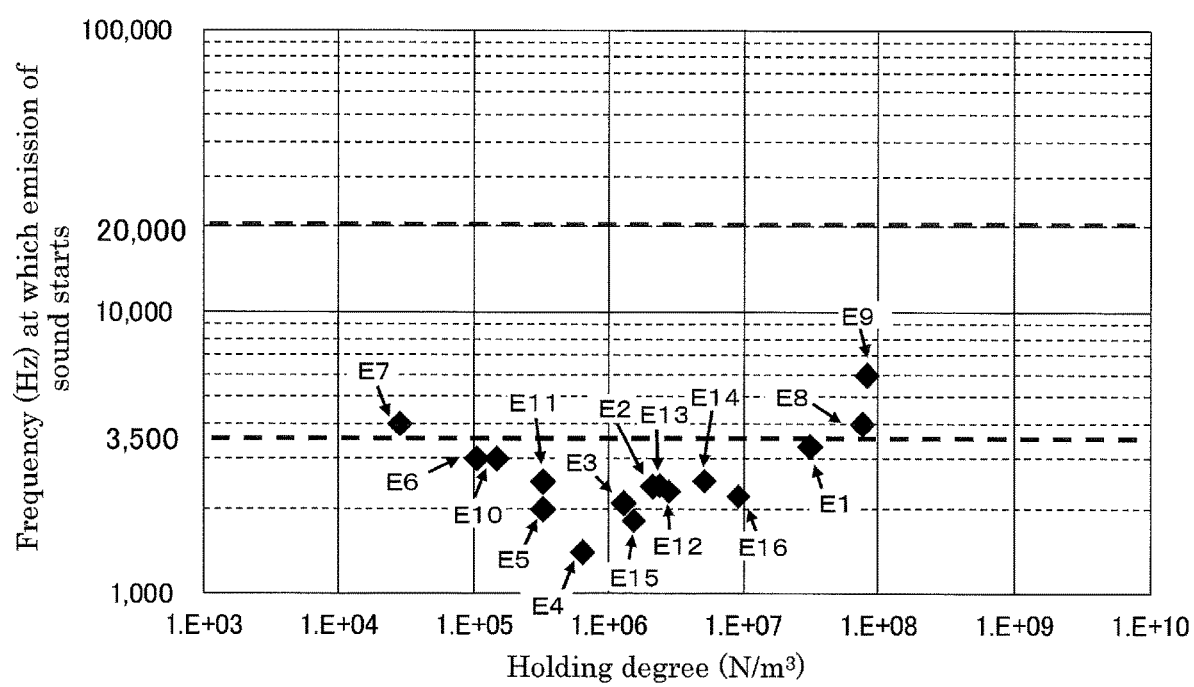
FIG. 9 is a graph showing a relationship between the holding degree of an interposed layer and a frequency at which emission of sound starts.
Figure 10:
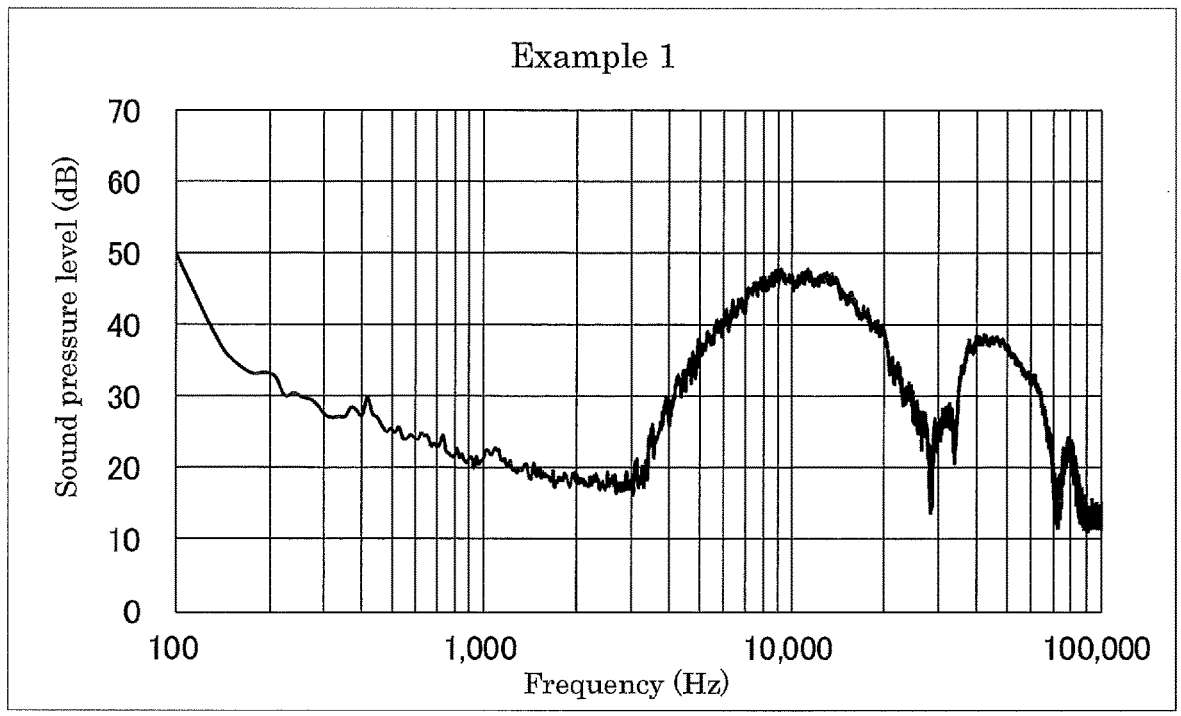
FIG. 10 is a graph showing the frequency characteristics of a sample of Example 1 in terms of sound pressure level.
Figure 11:
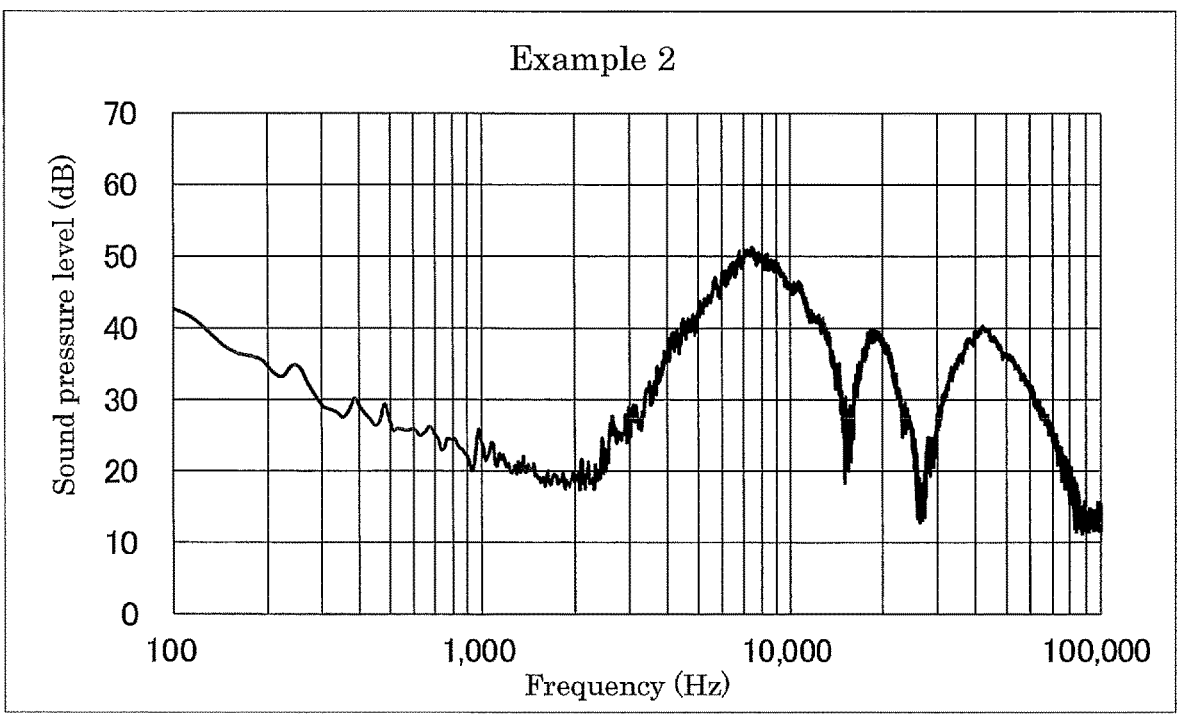
FIG. 11 is a graph showing the frequency characteristics of a sample of Example 2 in terms of sound pressure level.
Figure 12:
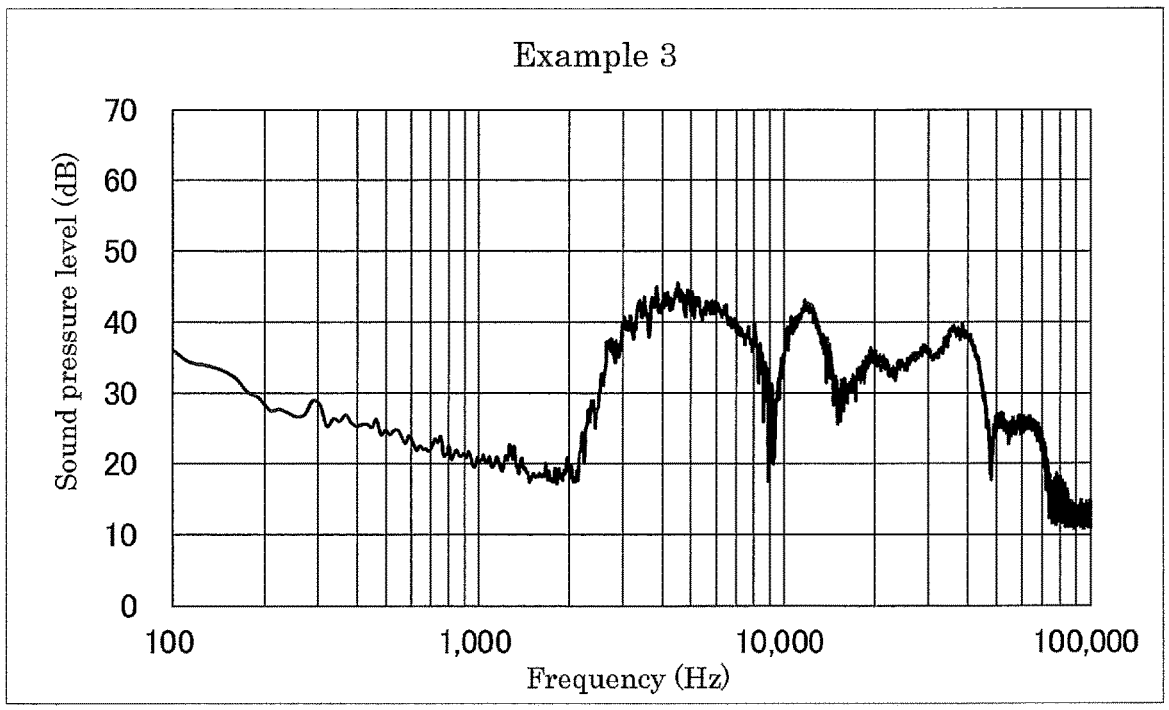
FIG. 12 is a graph showing the frequency characteristics of a sample of Example 3 in terms of sound pressure level.
Figure 13:
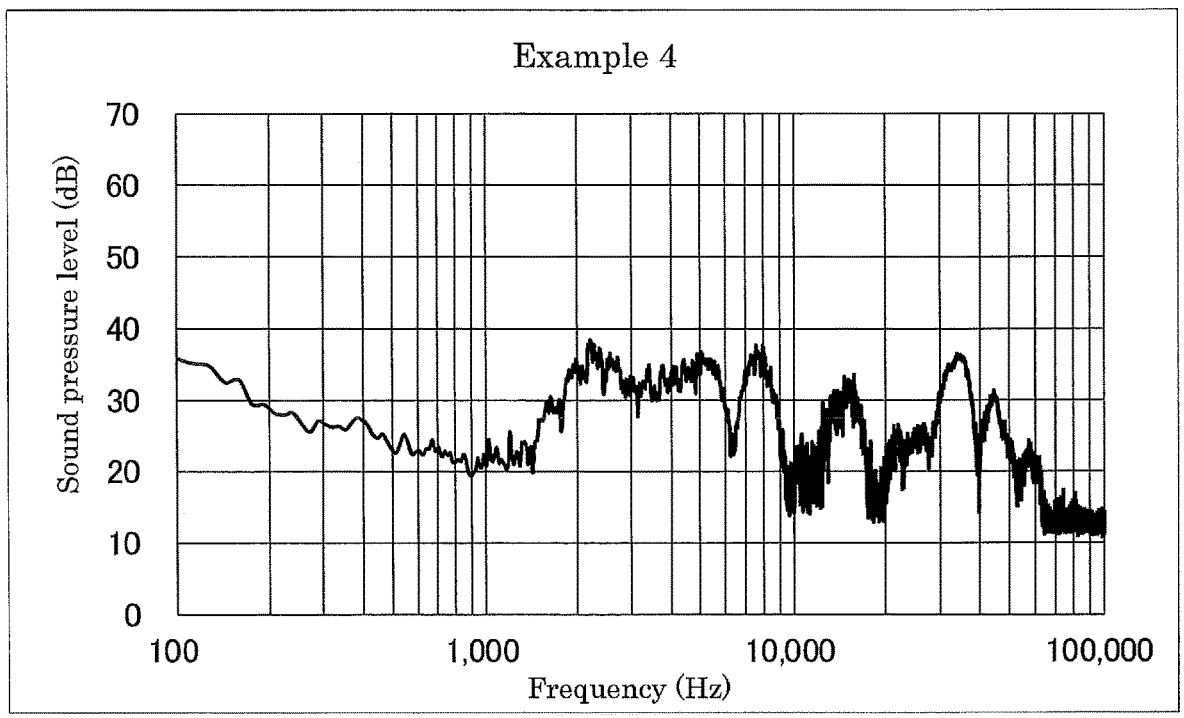
FIG. 13 is a graph showing the frequency characteristics of a sample of Example 4 in terms of sound pressure level.
Figure 14:
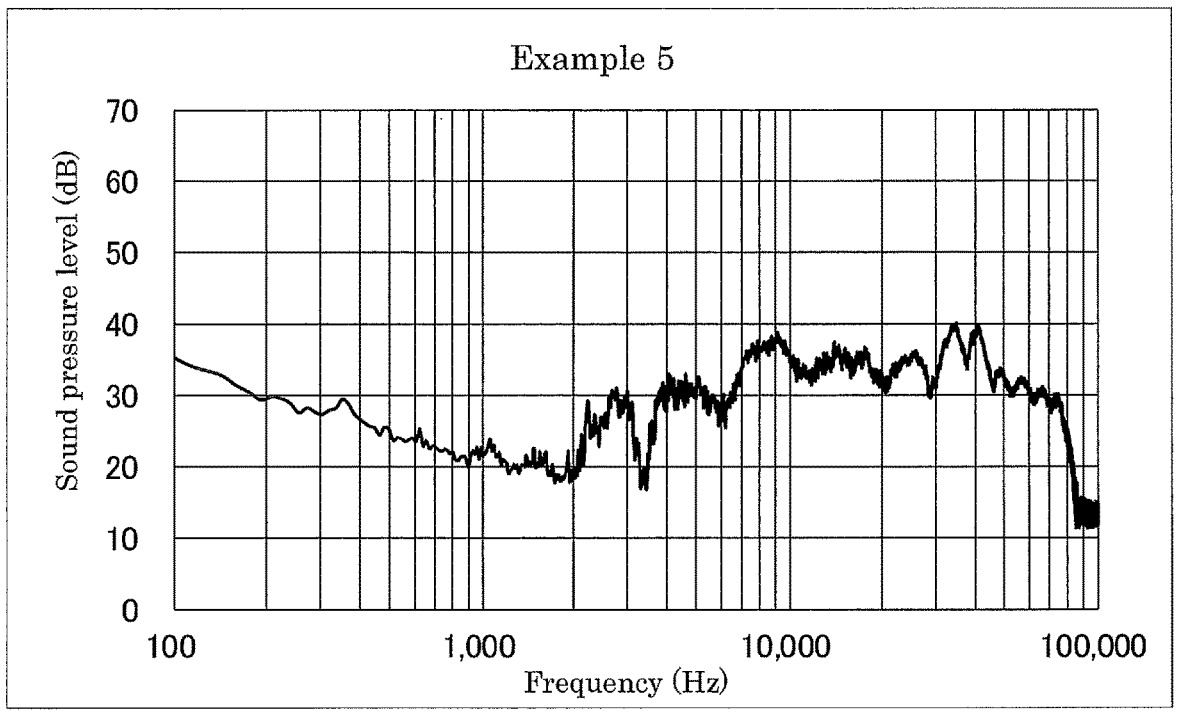
FIG. 14 is a graph showing the frequency characteristics of a sample of Example 5 in terms of sound pressure level.
Figure 15:
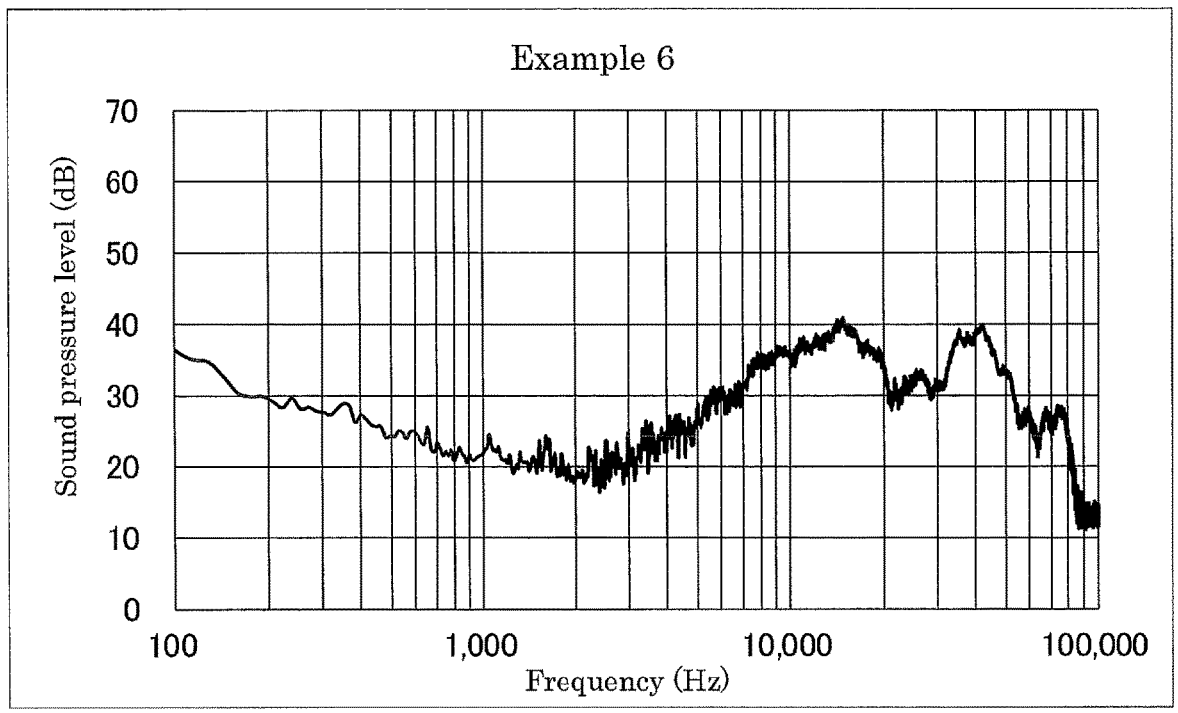
FIG. 15 is a graph showing the frequency characteristics of a sample of Example 6 in terms of sound pressure level.
Figure 16:
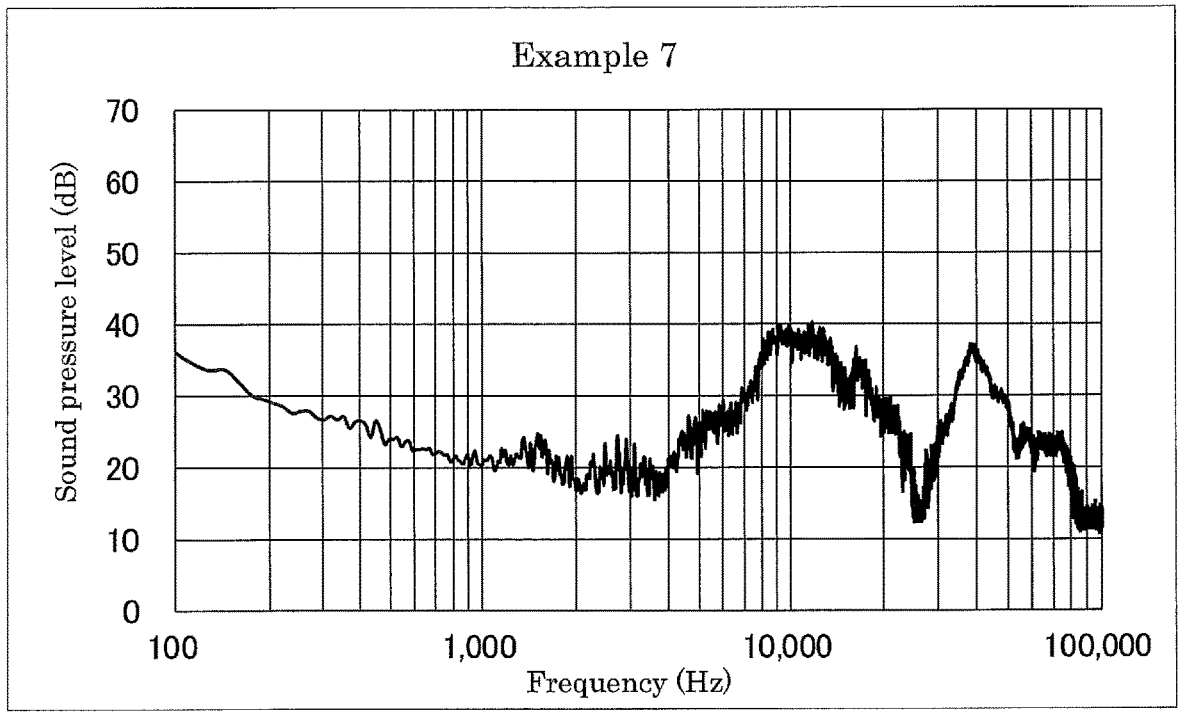
FIG. 16 is a graph showing the frequency characteristics of a sample of Example 7 in terms of sound pressure level.
Figure 17:
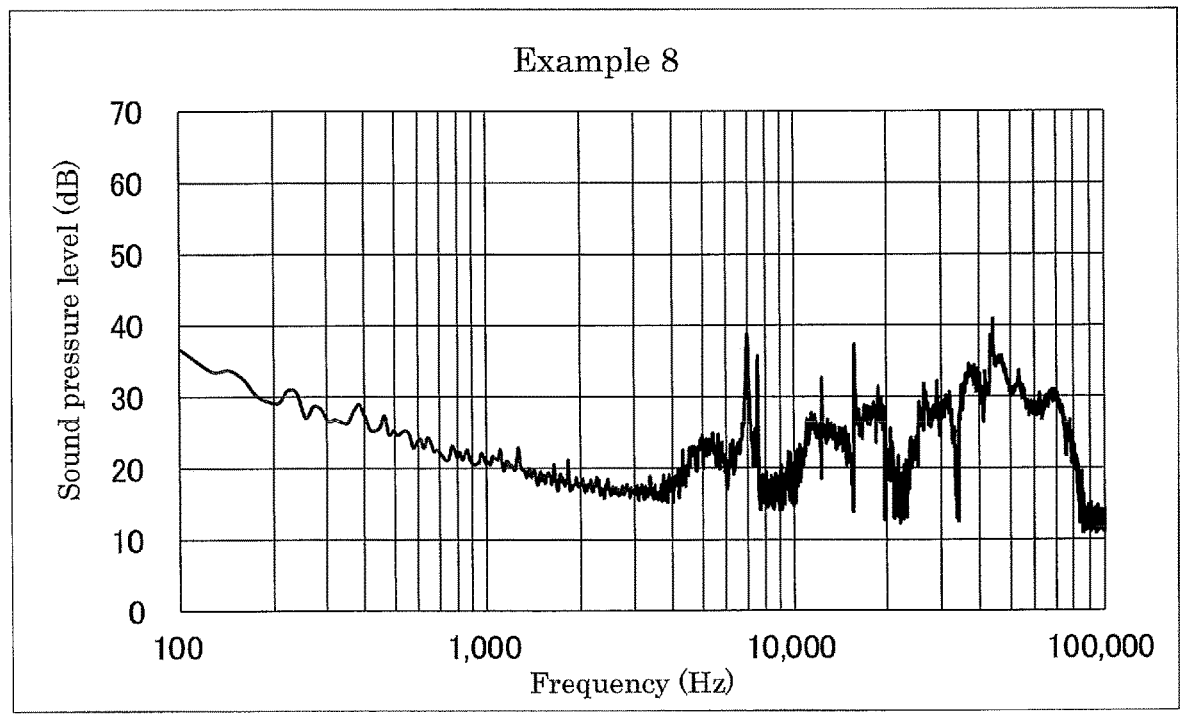
FIG. 17 is a graph showing the frequency characteristics of a sample of Example 8 in terms of sound pressure level.
Figure 18:
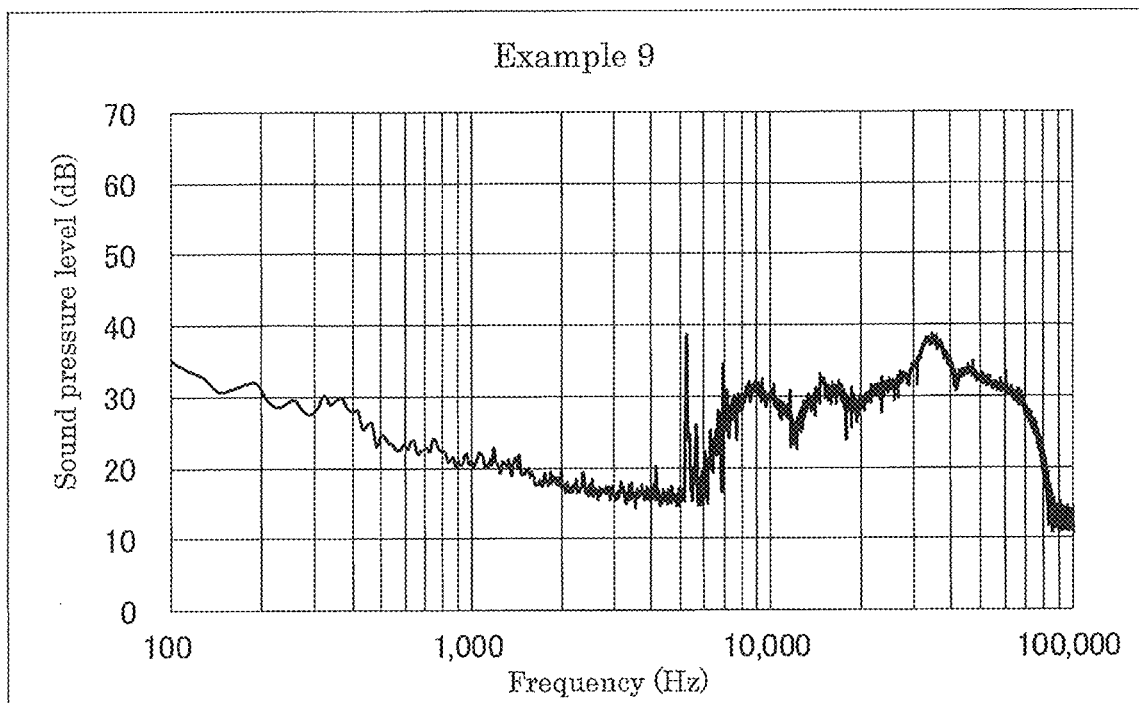
FIG. 18 is a graph showing the frequency characteristics of a sample of Example 9 in terms of sound pressure level.
Figure 19:
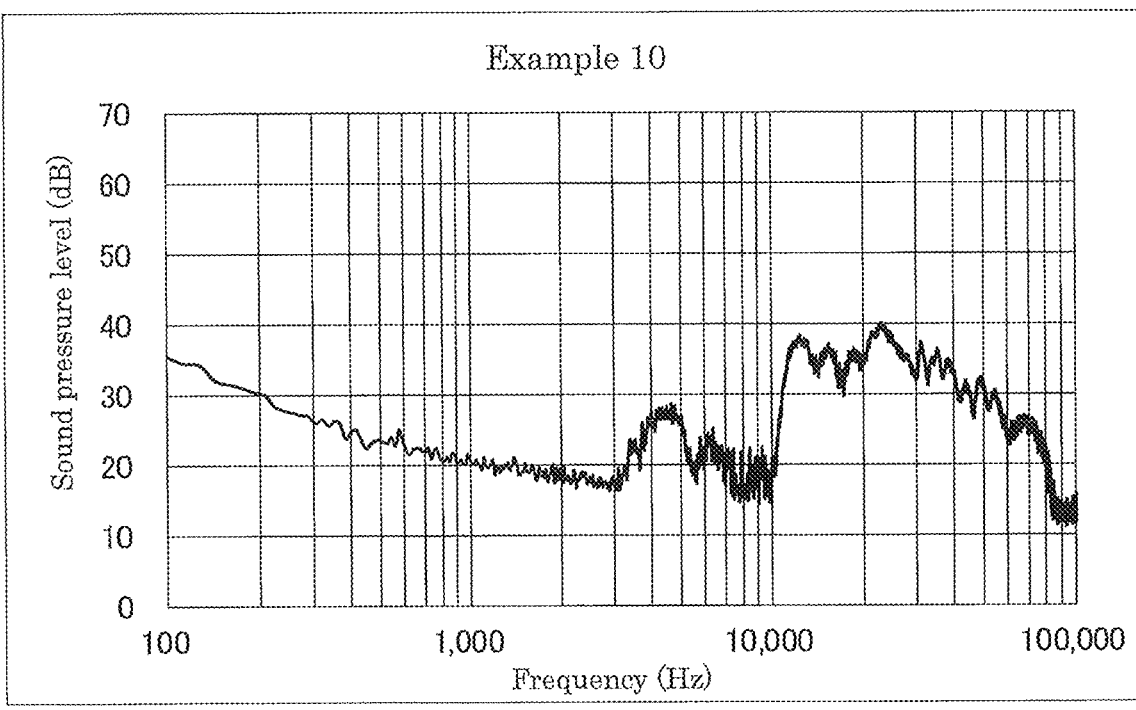
FIG. 19 is a graph showing the frequency characteristics of a sample of Example 10 in terms of sound pressure level.
Figure 20:
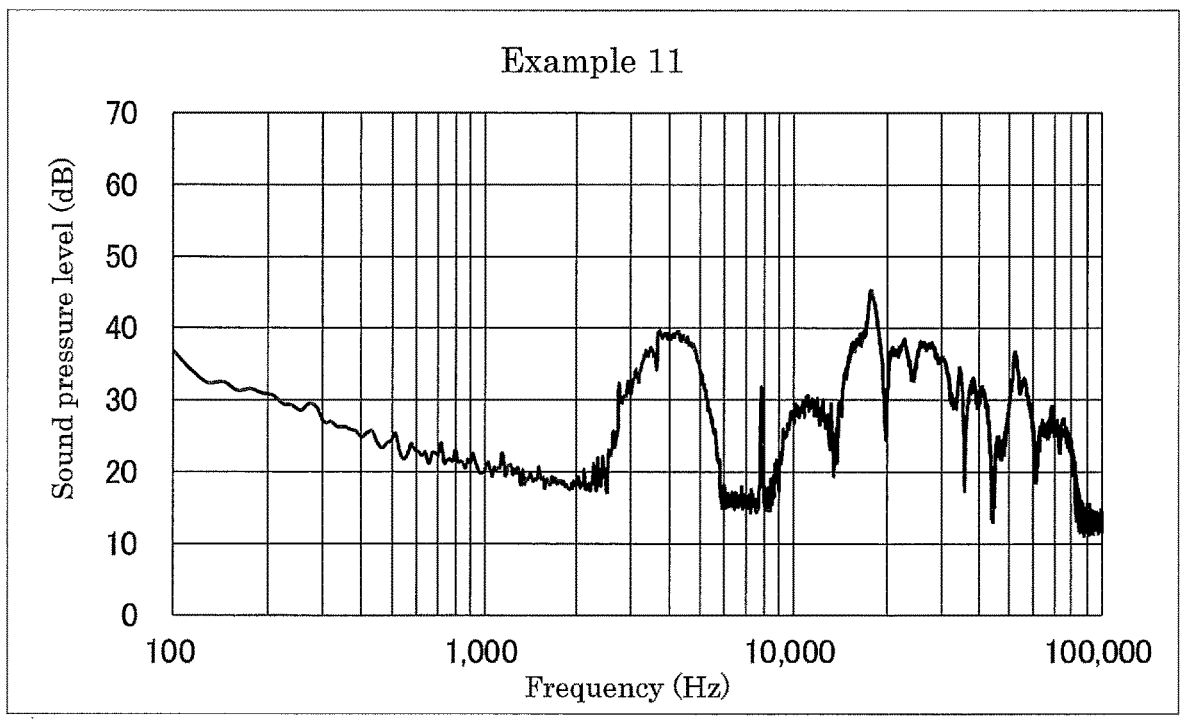
FIG. 20 is a graph showing the frequency characteristics of a sample of Example 11 in terms of sound pressure level.
Figure 21:
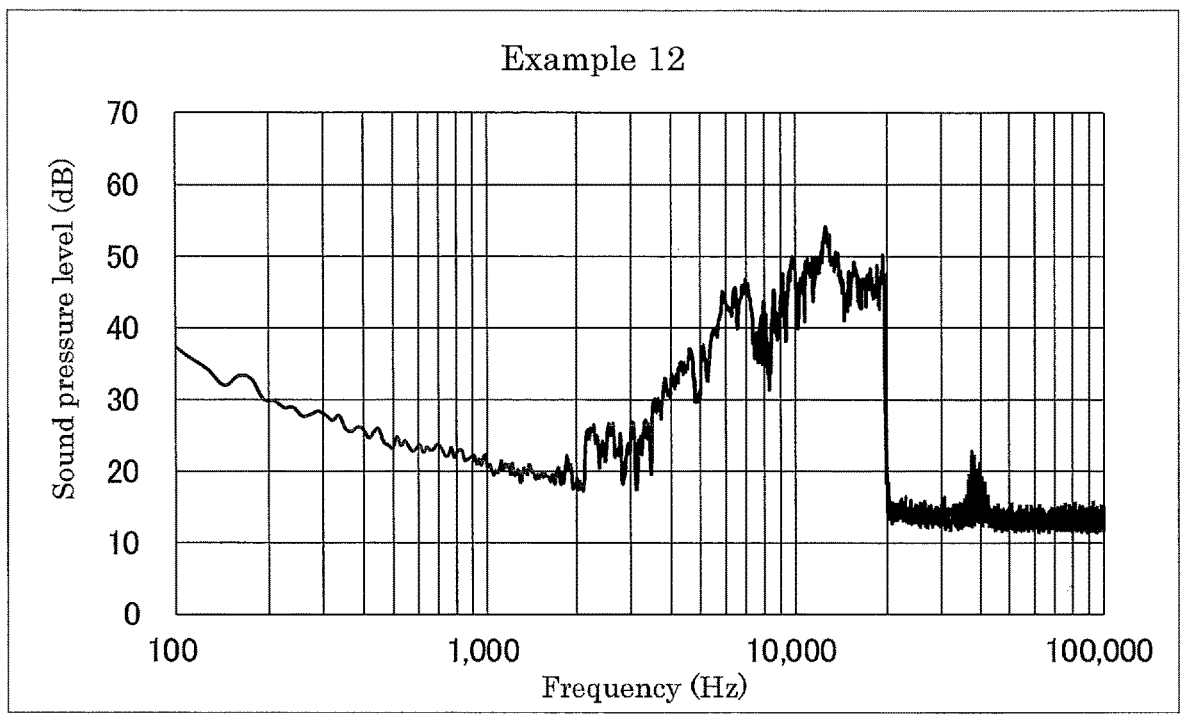
FIG. 21 is a graph showing the frequency characteristics of a sample of Example 12 in terms of sound pressure level.
Figure 22:
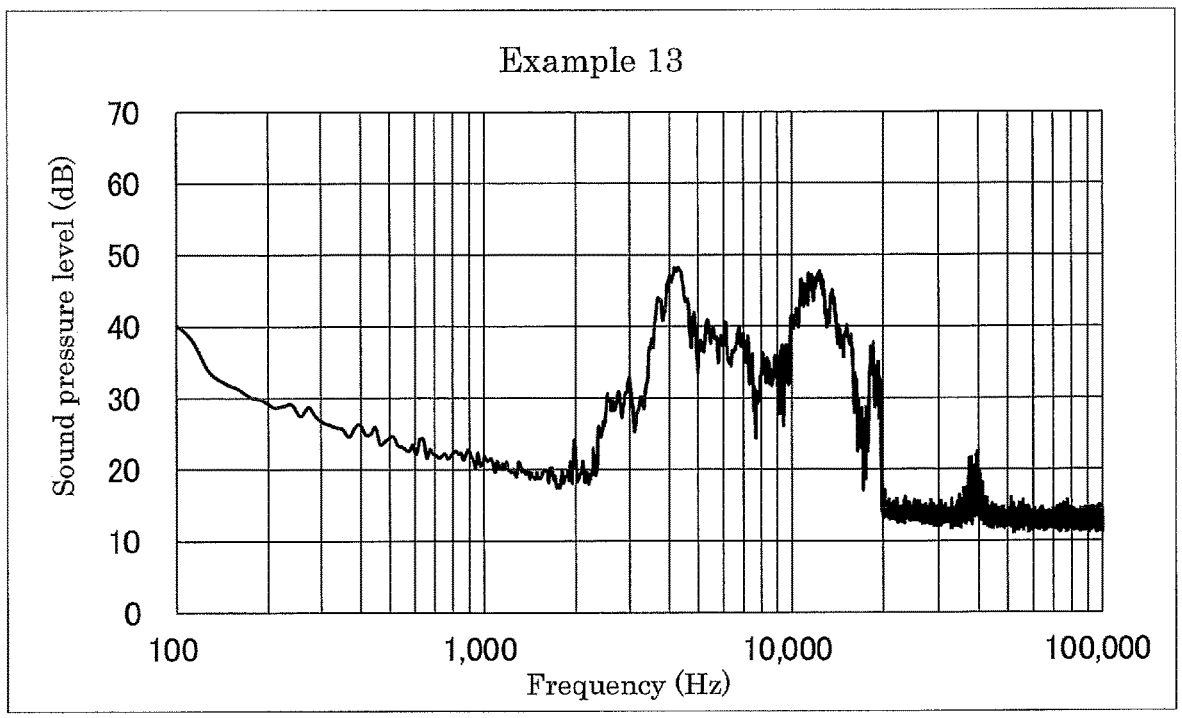
FIG. 22 is a graph showing the frequency characteristics of a sample of Example 13 in terms of sound pressure level.
Figure 23:
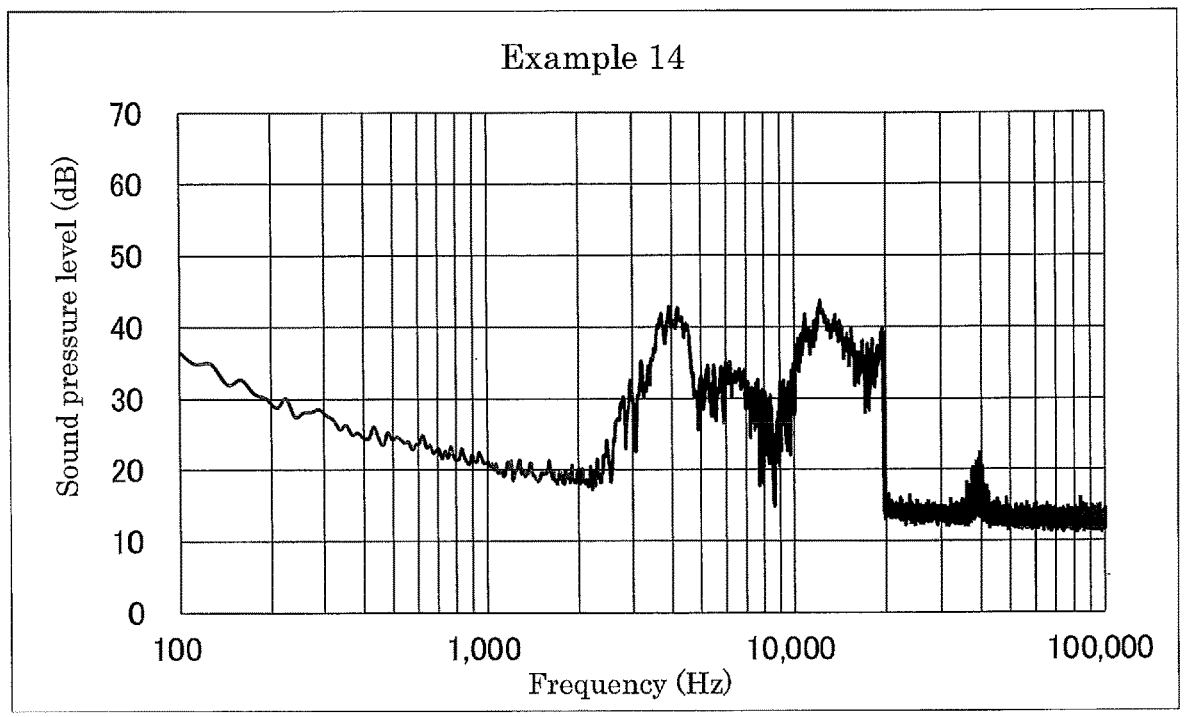
FIG. 23 is a graph showing the frequency characteristics of a sample of Example 14 in terms of sound pressure level.
Figure 24:
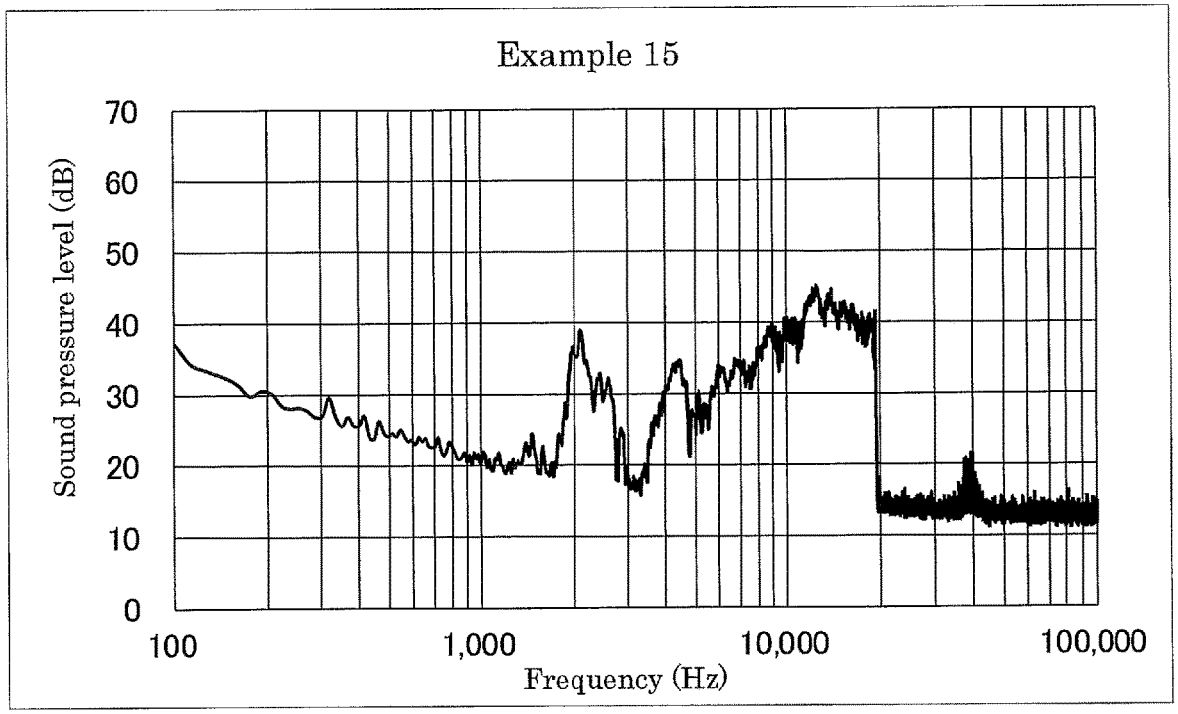
FIG. 24 is a graph showing the frequency characteristics of a sample of Example 15 in terms of sound pressure level.
Figure 25:
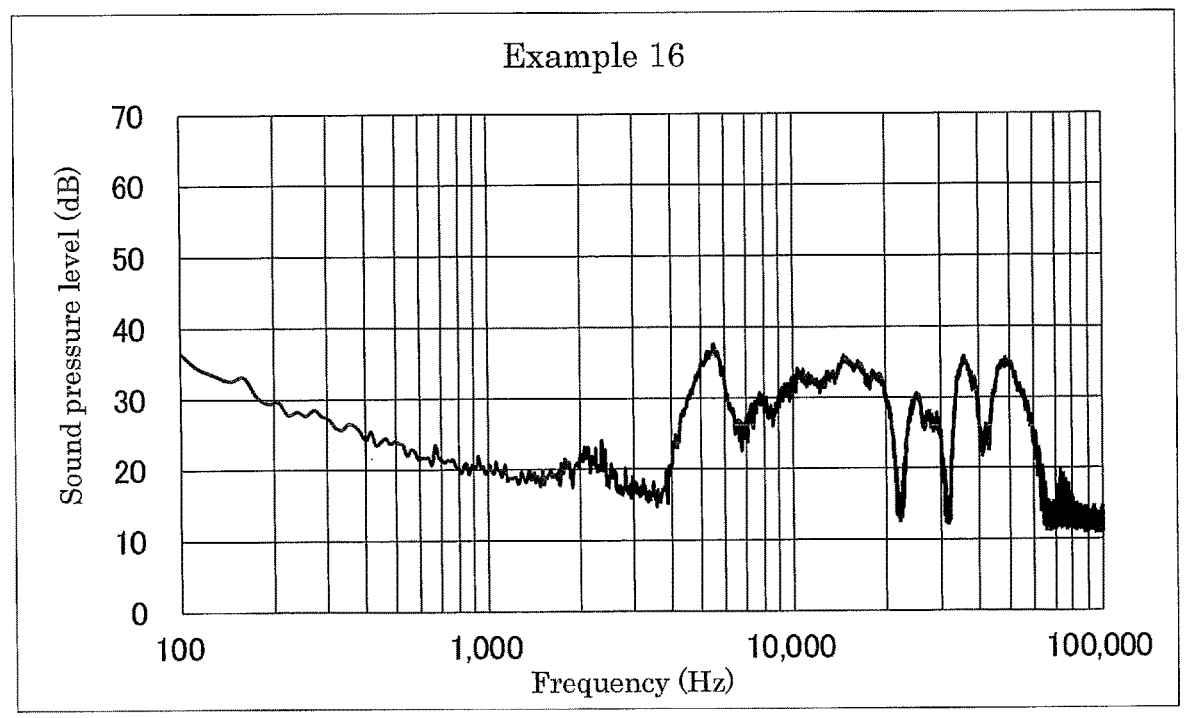
FIG. 25 is a graph showing the frequency characteristics of a sample of Example 16 in terms of sound pressure level.
Figure 26:
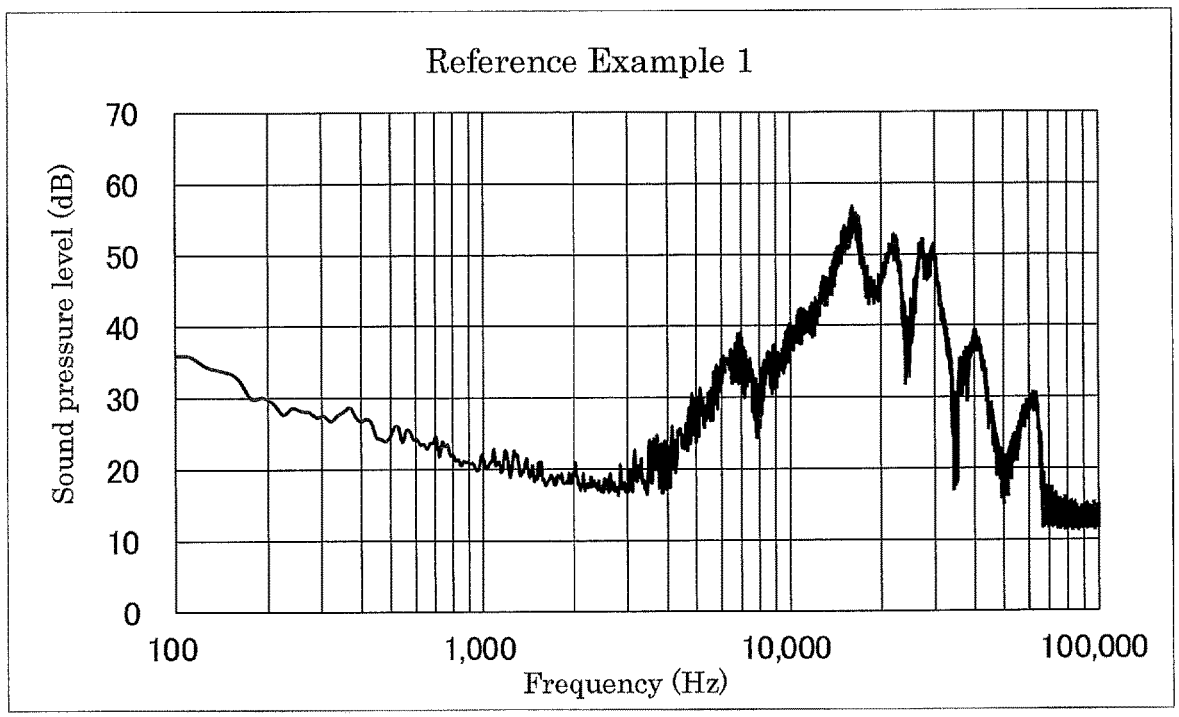
FIG. 26 is a graph showing the frequency characteristics of a sample of Reference Example 1 in terms of sound pressure level.
Figure 27:
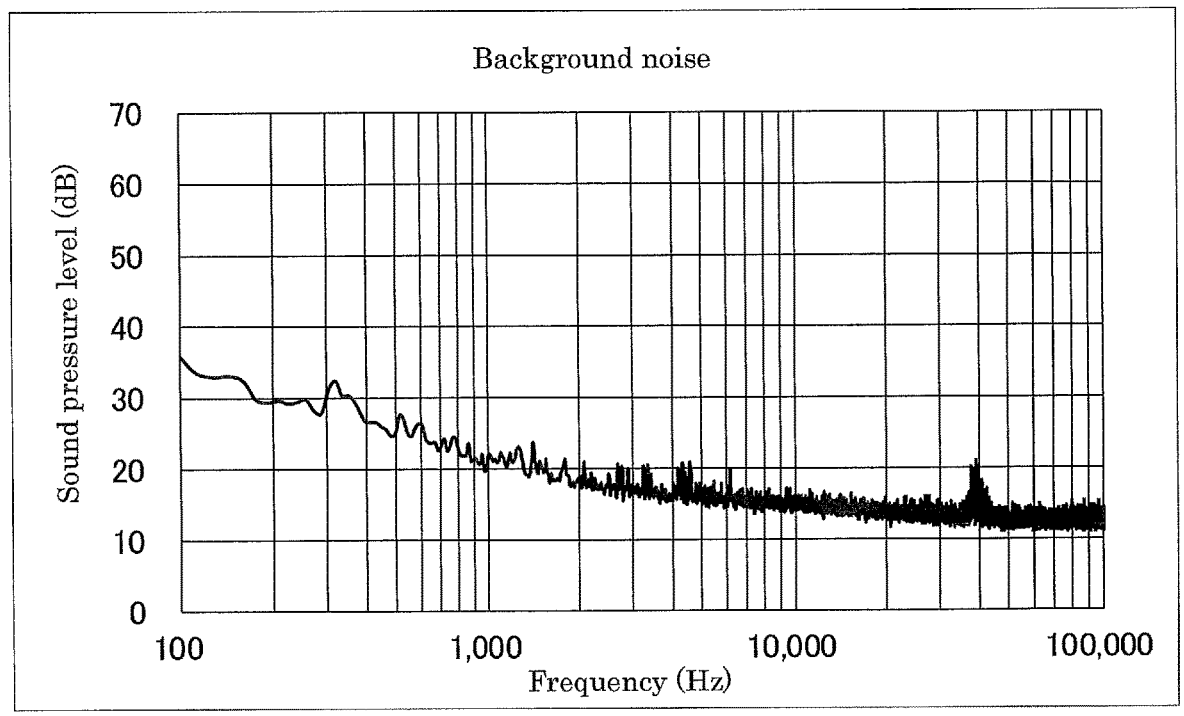
FIG. 27 is a graph showing the frequency characteristics of background noise in terms of sound pressure level.

The evaluation results for Examples 1 to 16 and Reference Example 1 are shown in FIG. 8A to FIG. 26. The frequency characteristics of background noise in terms of sound pressure level are shown in FIG. 27. E1 to E16 in FIG. 9 correspond to Examples 1 to 16.

<Vibration Evaluation>

Furthermore, voltage of 10 V at 2000 Hz was applied to the sample 404 of Example 1 using the output system described with reference to FIG. 6 to vibrate the sample 404. For the sample 404 vibrating, displacement of the piezoelectric film 35 in the thickness direction was measured by laser irradiation in a non-contact manner using a laser doppler vibrometer (PSV-400) manufactured by Polytec Japan. The measurement result indicates that both principal surfaces of the piezoelectric film 35 vibrate up and down as a whole.

The samples 404 of Examples 2 to 7 were also subjected to the measurement in the same manner. The measurement results for the samples 404 of Examples 2 to 7 also indicate that both principal surfaces of the piezoelectric film 35 vibrate up and down as a whole.

The samples 404 of Examples 1 to 7 were subjected to the measurement in the same manner, except that the frequency of voltage was changed from 2000 Hz to another frequency in the audible range. The results of this measurement for the samples 404 of Examples 1 to 7 also indicate that both principal surfaces of the piezoelectric film 35 vibrate up and down as a whole.

The vibration evaluation reveals that both principal surfaces of the piezoelectric film 35 can actually vibrate up and down as a whole as schematically shown in FIGS. 4A and 4B.

[Piezoelectric Film-Supporting Structure and Degree of Freedom of Vibration]

FIG. 3 is referred back to for an exemplary piezoelectric speaker-supporting structure of the present invention. In the piezoelectric speaker 10, the entire surface of the piezoelectric film 35 is fixed to the support 80 with the pressure-sensitive adhesive layers 51 and 52 and the interposed layer 40 therebetween.

Figure 28:
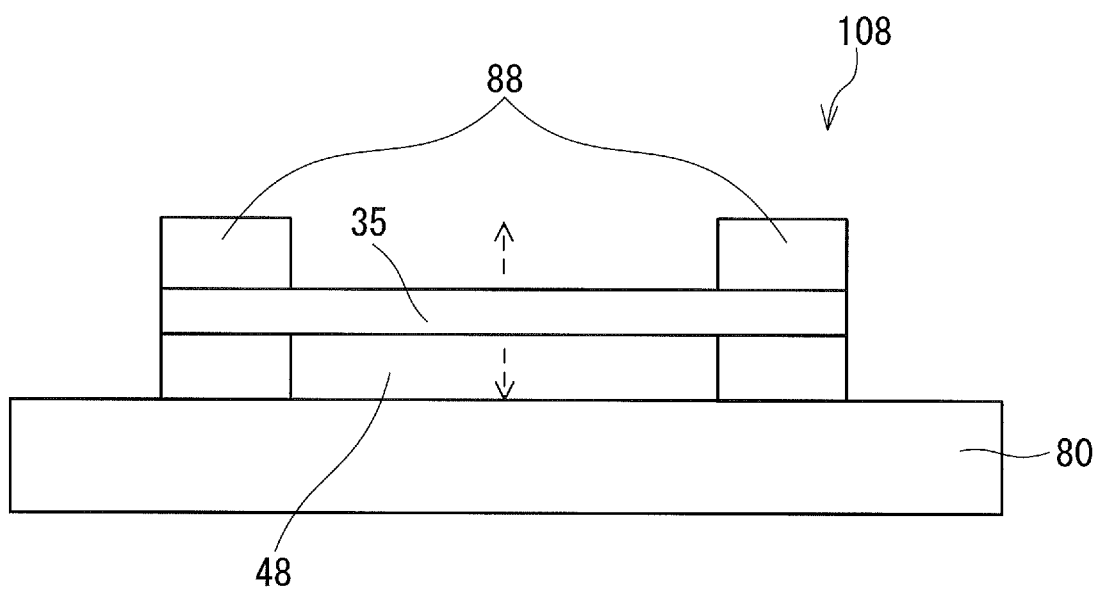
FIG. 28 illustrates a supporting structure of a piezoelectric film.

It is also conceivable that a portion of the piezoelectric film 35 is supported to be spaced away from the support 80 in order to prevent the support 80 from hindering vibration of the piezoelectric film 35. An exemplary supporting structure based on this design concept is shown in FIG. 28. In a hypothetical piezoelectric speaker 108 shown in FIG. 28, a frame 88 supports a peripheral portion of the piezoelectric film 35 at a position distant from the support 80.

It is easy to ensure a sufficient volume of sound emitted from a piezoelectric film already curved and fixed in one direction. Therefore, it is conceivable that, for example, in the piezoelectric speaker 108, a nonuniformly thick interposition having a convex upper surface is disposed in a space 48 surrounded by the piezoelectric film 35, the frame 88, and the support 80 and a central portion of the piezoelectric film 35 is pushed upward. However, such an interposition is not joined to the piezoelectric film 35 so as not to hinder vibration of the piezoelectric film 35. Therefore, even with the interposition disposed in the space 48, it is only the frame 88 that supports the piezoelectric film 35 so as to determine vibration of the piezoelectric film 35.

As described above, the piezoelectric speaker 108 shown in FIG. 28 employs the supporting structure locally supporting the piezoelectric film 35. On the other hand, as shown in FIG. 3, the piezoelectric film 35 of the piezoelectric speaker 10 is not supported at a particular portion. Unexpectedly, the piezoelectric speaker 10 exhibits practical acoustic characteristics in spite of the fact that the entire surface of the piezoelectric film 35 is fixed to the support 80. Specifically, in the piezoelectric speaker 10, even a peripheral portion of the piezoelectric film 35 possibly vibrates up and down. The piezoelectric film 35 can vibrate up and down as a whole. Therefore, compared to the piezoelectric speaker 108, the piezoelectric speaker 10 has a higher degree of freedom of vibration and is relatively advantageous in achieving good sound emission characteristics.

The invention claimed is:

1. A piezoelectric speaker, comprising:
  a piezoelectric film comprising a first electrode, a second electrode, and a piezoelectric body sandwiched by the first electrode and the second electrode;
  a first joining layer having pressure-sensitive adhesiveness or adhesiveness;

an interposed layer disposed between the piezoelectric film and the first joining layer; and a second joining layer having pressure-sensitive adhesiveness or adhesiveness, wherein both principal surfaces of the piezoelectric film vibrate up and down as a whole, the second joining layer is disposed between the first electrode and the interposed layer, the first electrode includes a first surface as one of the principal surfaces of the piezoelectric film, the second joining layer includes a second surface and a third surface, the interposed layer includes a fourth surface, the second surface is in immediate physical contact with the first surface, and the third surface is in immediate physical contact with the fourth surface.

2. The piezoelectric speaker according to claim 1, wherein the first joining layer and the interposed layer each have a uniform thickness.

3. The piezoelectric speaker according to claim 1, wherein the first joining layer comprises a first joining face, and the first joining face is (i) a bare surface, or (ii) covered by a release layer capable of being separated from the first joining face, the release layer having a film and a release agent applied to a principal surface on the first joining face side of the film.

4. The piezoelectric speaker according to claim 1, wherein the interposed layer is a resin layer and/or a porous body layer.

5. The piezoelectric speaker according to claim 4, wherein the interposed layer is a resin layer and/or a porous body layer other than an adhesive layer and a pressure-sensitive adhesive layer.

6. The piezoelectric speaker according to claim 1, wherein the interposed layer is in immediate physical contact with the first joining layer.

7. The piezoelectric speaker according to claim 1, further comprising a first electrical pathway electrically connected to the first electrode, wherein the first electrical pathway includes a first portion disposed so that at least a portion of the first electrode overlaps the first portion when the piezoelectric film is viewed in plan, and a size of the first portion with respect to a thickness direction of the piezoelectric film is smaller than a thickness of the interposed layer.

8. The piezoelectric speaker according to claim 1, further comprising a first electrical pathway electrically connected to the first electrode, wherein the first electrical pathway includes a first portion disposed so that at least a portion of the first electrode overlaps the first portion when the piezoelectric film is viewed in plan, and a size of the first portion with respect to a thickness direction of the piezoelectric film is smaller than a thickness of the second joining layer.

9. The piezoelectric speaker according to claim 1, further comprising a first electrical pathway electrically connected to the first electrode, wherein the first electrical pathway is spaced from the interposed layer.

10. The piezoelectric speaker according to claim 1, wherein the interposed layer is disposed on a region accounting for 90% or more of the area of the piezoelectric film when the piezoelectric film is viewed in plan.

11. The piezoelectric speaker according to claim 1, wherein the interposed layer is configured to have a holding degree of $1\times10^4$ N/m$^3$ or more and $5\times10^8$ N/m$^3$ or less.

12. A piezoelectric speaker, comprising:

a piezoelectric film comprising a first electrode, a second electrode, and a piezoelectric body sandwiched by the first electrode and the second electrode, wherein the piezoelectric film includes a principal surface, the principal surface being on a side of an interposed layer and defined as a supported face;

a first joining layer having pressure-sensitive adhesiveness or adhesiveness;

the interposed layer disposed between the piezoelectric film and the first joining layer; and a second joining layer joining the interposed layer to an entirety of the supported face of the piezoelectric film, wherein the second joining layer is a layer having pressure-sensitive adhesiveness or adhesiveness, the first electrode includes a first surface as the supported face, the second joining layer includes a second surface and a third surface, the interposed layer includes a fourth surface, the second surface is in immediate physical contact with the first surface, the third surface is in immediate physical contact with the fourth surface.

13. The piezoelectric speaker according to claim 12, wherein the interposed layer is in immediate physical contact with the first joining layer.

14. The piezoelectric speaker according to claim 12, further comprising a first electrical pathway electrically connected to the first electrode, wherein the first electrical pathway includes a first portion disposed so that at least a portion of the first electrode overlaps the first portion when the piezoelectric film is viewed in plan, and a size of the first portion with respect to a thickness direction of the piezoelectric film is smaller than a thickness of the interposed layer.

15. The piezoelectric speaker according to claim 12, further comprising a first electrical pathway electrically connected to the first electrode, wherein the first electrical pathway includes a first portion disposed so that at least a portion of the first electrode overlaps the first portion when the piezoelectric film is viewed in plan, and a size of the first portion with respect to a thickness direction of the piezoelectric film is smaller than a thickness of the second joining layer.

16. The piezoelectric speaker according to claim 12, further comprising a first electrical pathway electrically connected to the first electrode, wherein the first electrical pathway is spaced from the interposed layer.

17. The piezoelectric speaker according to claim 12, wherein the interposed layer is configured to have a holding degree of $1\times10^4$ N/m$^3$ or more and $5\times10^8$ N/m$^3$ or less.

* * * * *